United States Patent
Chau et al.

[11] Patent Number: 6,165,826
[45] Date of Patent: *Dec. 26, 2000

[54] TRANSISTOR WITH LOW RESISTANCE TIP AND METHOD OF FABRICATION IN A CMOS PROCESS

[75] Inventors: Robert S. Chau, Beaverton; Chia-Hong Jan, Portland; Chan-Hong Chern, Portland; Leopoldo D. Yau, Portland, all of Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/581,243

[22] Filed: Dec. 29, 1995

Related U.S. Application Data

[63] Continuation-in-part of application No. 08/363,749, Dec. 23, 1994, Pat. No. 5,710,450.

[51] Int. Cl.[7] .................................................. H01L 21/8238
[52] U.S. Cl. ........................... 438/231; 438/226; 438/233; 438/232; 438/305; 438/306; 438/586; 438/589; 438/576; 438/558; 438/561; 438/664
[58] Field of Search ..................................... 438/589–663, 438/664, 191, 226–223, 229, 230, 231, 232, 259, 270, 330, 301, 303, 305, 306, 586, 576, 558, 565, 581, 583, FOR 168, FOR 180, FOR 197, FOR 216, FOR 217, FOR 218, FOR 251, FOR 250, FOR 219; 148/DIG. 147, DIG. 19, DIG. 59; 257/288, 900

[56] References Cited

U.S. PATENT DOCUMENTS

| | | | |
|---|---|---|---|
| 4,133,704 | 1/1979 | MacIver et al. | 148/1.5 |
| 4,683,645 | 8/1987 | Naguib et al. | 437/41 |
| 4,876,213 | 10/1989 | Pfiester | 437/34 |
| 4,998,150 | 3/1991 | Rodder et al. | 357/23.1 |
| 5,006,476 | 4/1991 | De Jong et al. | 437/31 |
| 5,162,263 | 11/1992 | Kunishima et al. | 437/200 |
| 5,168,072 | 12/1992 | Moslehi | 437/41 |
| 5,231,042 | 7/1993 | Ilderem et al. | 437/44 |
| 5,285,088 | 2/1994 | Sato et al. | 257/192 |
| 5,336,903 | 8/1994 | Ozturk et al. | 257/19 |
| 5,341,014 | 8/1994 | Fujii et al. | 257/377 |
| 5,352,631 | 10/1994 | Sitaram et al. | 437/200 |
| 5,393,685 | 2/1995 | Yoo et al. | 437/44 |
| 5,397,909 | 3/1995 | Moslehi | 257/383 |
| 5,405,795 | 4/1995 | Beyer et al. | 437/89 |

(List continued on next page.)

FOREIGN PATENT DOCUMENTS

| | | |
|---|---|---|
| 8448061 | 5/1998 | European Pat. Off. . |
| 361051959 | 3/1986 | Japan ........................... 438/FOR 168 |

*Primary Examiner*—Long Pham
*Attorney, Agent, or Firm*—Blakely, Sokoloff, Taylor & Zafman LLP

[57] ABSTRACT

A novel transistor with a low resistance ultra shallow tip region and its method of fabrication in a complementary metal oxide semiconductor (CMOS) process. According to the preferred method of the present invention, a first gate dielectric and a first gate electrode are formed on a first portion of a semiconductor substrate having a first conductivity type, and a second gate dielectric and a said gate electrode are formed on a second portion of semiconductor substrate having a second conductivity type. A silicon nitride layer is formed over the first portion of the semiconductor substrate including the first gate electrode and over the second portion of the semiconductor substrate including the second gate electrode. The silicon nitride layer is removed from the second portion of the silicon substrate and from the top of the second gate electrode to thereby form a first pair of silicon nitride spacers adjacent to opposite sides of the second gate electrode. A pair of recesses are then formed in the second portion of the semiconductor substrate in alignment with the first pair of sidewall spacers. A selectively deposited semiconductor material is then formed in the recesses.

52 Claims, 13 Drawing Sheets

U.S. PATENT DOCUMENTS

| | | | |
|---|---|---|---|
| 5,478,776 | 12/1995 | Luftman et al. | 437/163 |
| 5,538,909 | 7/1996 | Hsu | 437/35 |
| 5,569,624 | 10/1996 | Weiner | 437/200 |
| 5,620,912 | 4/1997 | Hwang et al. | 438/301 |
| 5,710,450 | 1/1998 | Chau et al. | 257/344 |
| 5,726,071 | 3/1998 | Segawa et al. | 437/57 |
| 5,770,507 | 6/1998 | Chen et al. | 438/305 |

TRANSISTOR WITH LOW RESISTANCE TIP AND METHOD OF FABRICATION IN A CMOS PROCESS

This application is a Continuation-in-Part of U.S. patent application Ser. No. 08/363,749, filed Dec. 23, 1994 now U.S. Pat. No. 5,710,450 and assigned to the present Assignee.

BACKGROUND OF THE INVENTION

1. Field of the Invention

The present invention relates to the field of semiconductor integrated circuits, and more specifically, to the ultra large-scale fabrication of submicron transistors.

2. Discussion of Relates Art

Today literally millions of individual transistors are coupled together to form very large-scale integrated (VLSI) circuits, such as microprocessors, memories, and applications specific integrated circuits (ICs). Presently, the most advanced ICs are made up of approximately three million transistors, such as metal oxide semiconductor (MOS) field effect transistors having gate lengths on the order of 0.5 μm. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 μm. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punchthrough characteristics of the fabricated transistor. Unfortunately, the length of tip region 110, however, must be larger than 0.07 μm to insure that the later, heavy dose, deep source/drain implant does not swamp and overwhelm tip region 110. Thus, in the fabrication of a small scale transistor with conventional methods, as shown in FIG. 1, the tip region 110 is both shallow and long. Because tip region 110 is both shallow and long, tip region 110 exhibits substantial parasitic resistance. Parasitic resistance adversely effects (reduces) the transistors drive current.

Thus, what is needed is a novel transistor with a low resistance ultra shallow tip region with a VLSI manufacturable method of fabrication in a CMOS process.

SUMMARY OF THE INVENTION

A novel transistor with a low resistance ultra shallow tip region and its method of fabrication in a complementary metal oxide semiconductor process (CMOS) is described. According to a preferred method of the present invention, a first gate dielectric and a first gate electrode are formed on a first portion of a semiconductor substrate having a first conductivity type, and a second gate dielectric and a second gate electrode are formed on a second portion of a semiconductor substrate having a second conductivity type. Next, ions of a second conductivity type are implanted into the first portion of the semiconductor substrate in alignment with the outside edges of the first gate electrode. A silicon nitride layer is then formed over the first portion of the semiconductor substrate including the first gate electrode and over the second portion of the semiconductor substrate including the second gate electrode. The silicon nitride layer is then removed from the second portion of the silicon substrate and from the top of the second gate electrode to thereby form a first pair of silicon nitride spacers adjacent to opposite sides of the second gate electrode. A pair of recesses are then formed in the second portion of the semiconductor substrate in alignment with the first pair of silicon nitride spacers. A selectively deposited semiconductor material is then formed in the recesses. Dopants are then diffused from the selectively deposited semiconductor material into the substrate beneath the first pair of silicon nitride spacers. Next, a first pair of sidewall spacers are formed adjacent to opposite sides of the first gate electrode and a second pair of sidewall spacers are formed on the deposited semiconductor material adjacent to the outside edge of the first pair of silicon nitride spacers. Ions of a second conductivity type are then implanted into the first portion of the semiconductor substrate in alignment with the outside edges of the first pair of sidewall spacers adjacent to the first gate electrode to thereby form a first pair of source/drain contact regions in the first portion of the semiconductor substrate. Silicide is then formed on the source/drain contact regions and on the first gate electrode and on the deposited semiconductor material in alignment with the outside edges of the second pair of sidewall spacers are on the second gate electrode.

BRIEF DESCRIPTION OF THE DRAWINGS

FIG. 3b is an illustration of a cross-sectional view of the formation of a N− tip region in the p-well in alignment with opposite sidewalls of the first gate electrode of the substrate of FIG. 3a.

FIG. 4a is an illustration of a cross-sectional view showing the formation of a boron doped glass layer and the formation of N– tip regions in the substrate of FIG. 3a.

FIG. 4b is an illustration of a cross-sectional view showing the formation of a silicon nitride layer over the substrate of FIG. 4a.

FIG. 5a is an illustration of a cross-sectional view showing the formation of a silicon nitride layer over the substrate of FIG. 3a.

FIG. 5b is an illustration of a cross-sectional view showing the formation of spacers and recesses on the substrate of FIG. 5a.

FIG. 6b is an illustration of a cross-sectional view showing the formation of a mask and the ion implantation of the substrate of FIG. 6a.

FIG. 7a is an illustration of a cross-sectional view showing the formation and patterning of a boron doped glass layer on the substrate of FIG. 3a.

FIG. 7b is an illustration of a cross-sectional view showing the formation of a silicon nitride layer over the substrate of FIG. 7a.

DETAILED DESCRIPTION OF THE PRESENT INVENTION

A novel transistor with a low resistance ultra shallow tip and its method of fabrication in a complementary metal oxide semiconductor (CMOS) process is described. In the following description numerous specific details are set forth, such as specific materials, dimensions, and processes, etc., in order to provide a thorough understanding of the present invention. It will be obvious, however, to one skilled in the art, that the invention may be practiced without these specific details. In other instances, well-known semiconductor equipment and processes have not been described in particular detail in order to avoid unnecessarily obscuring the present invention.

Figure 1:
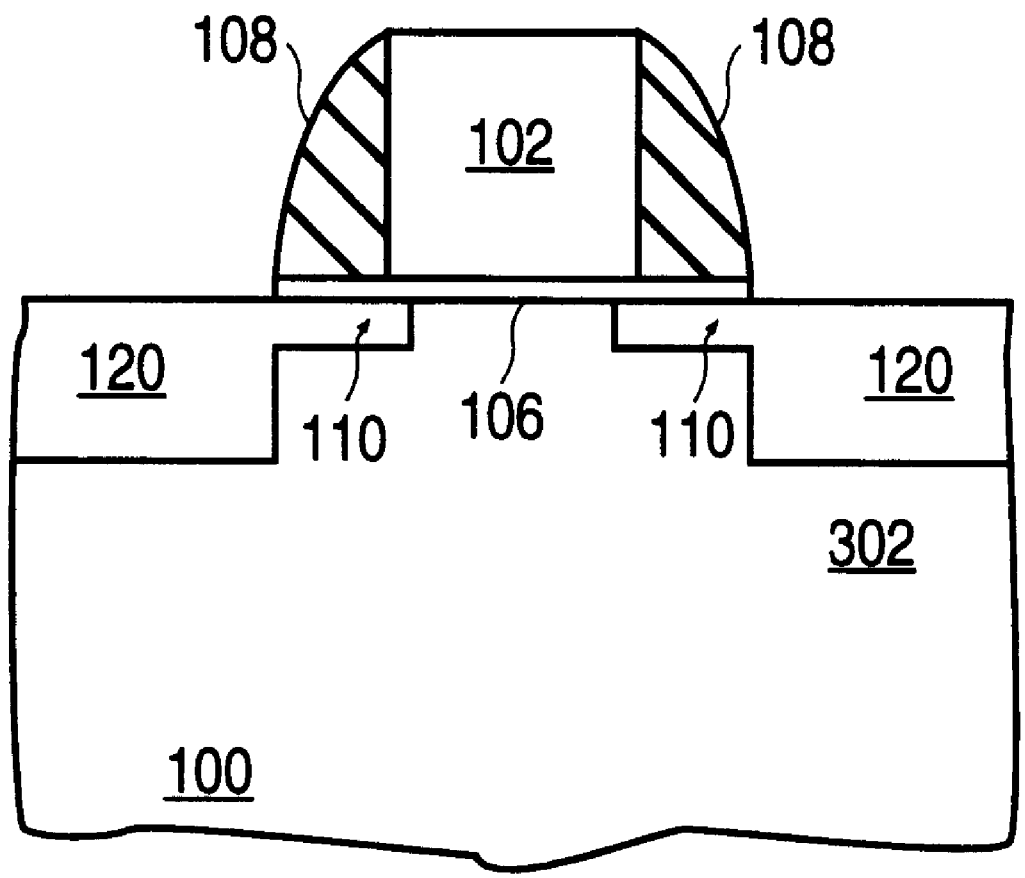
FIG. 1 is an illustration of a cross-sectional view of a conventional transistor.
Figure 2:
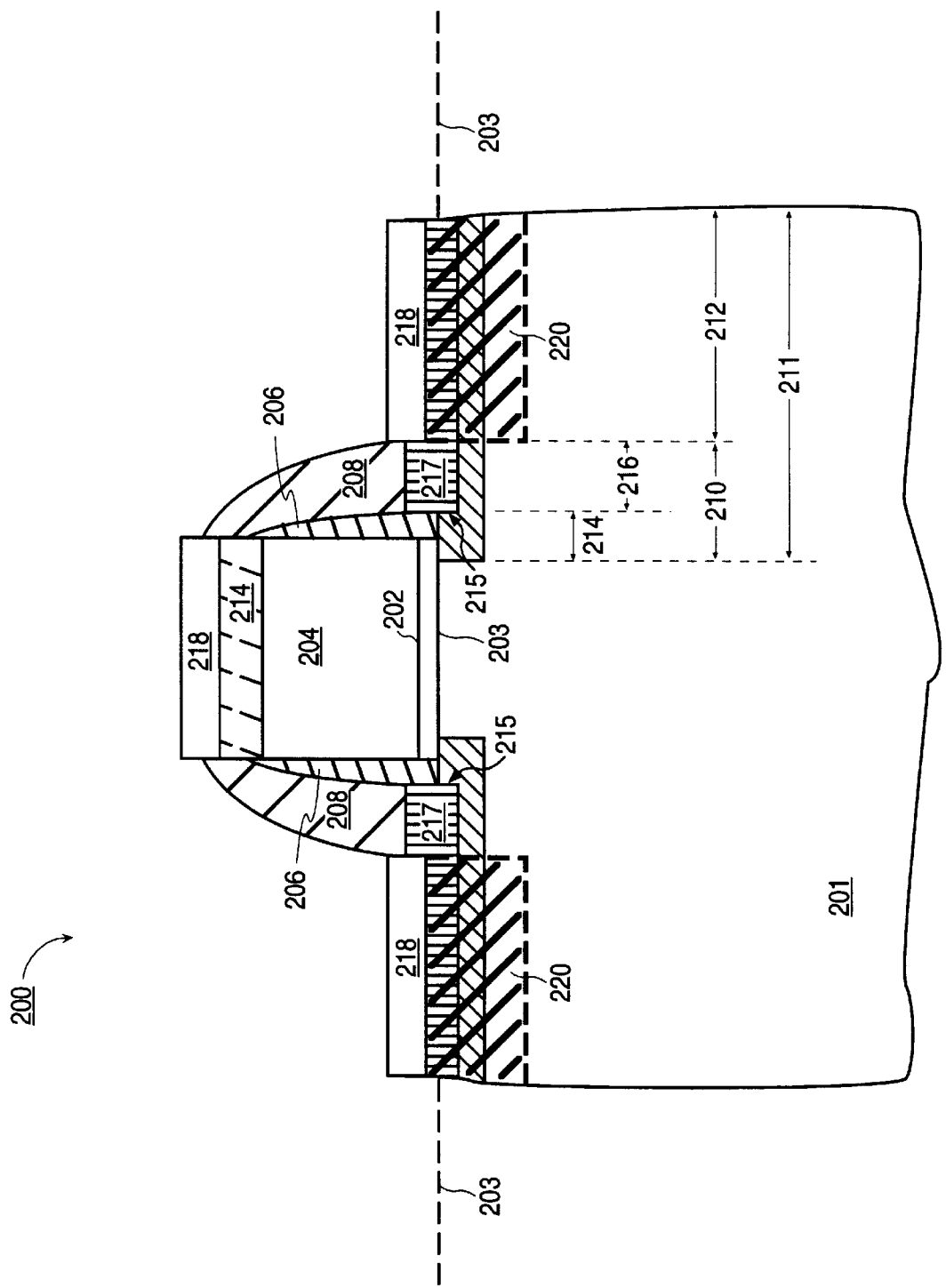
FIG. 2 is an illustration of a cross-sectional view of a low resistance ultra shallow tip transistor of the present invention.

A preferred embodiment of a novel transistor 200 with low resistivity, ultra shallow tip of the present invention is shown in FIG. 2. Transistor 200 is formed on a silicon substrate or well 201. A gate dielectric layer 202 is formed on a surface 203 of substrate 201 and a gate electrode 204 is in turn formed on gate dielectric layer 202. A first pair of thin sidewall spacers 206 are formed on opposite sides of gate electrode 204 (spacers 206 run along the "width" of gate electrode 204). Transistor 200 also includes a second pair of substantially thicker sidewall spacers 208 formed adjacent to the outside edges of the first pair of sidewall spacers 206. Transistor 200 includes a pair of source/drain regions 211 each comprising a pair of tips or source/drain extensions 210 and a source/drain contact region 212.

Tip or source/drain extension 210 is defined as the source/drain region located beneath second sidewall spacer 208, first sidewall spacer 206, and the outside edge of gate electrode 204. Tip 210 comprises an ultra shallow tip portion 214 and a raised tip portion 216. Ultra shallow tip portion 214 is comprised of a doped semiconductor substrate 215 formed by "out diffusing" dopants from selectively deposited semiconductor material 217 into substrate 201. Ultra shallow tip 214 extends from beneath first sidewall spacer 206 to the outside edges of gate electrode 204. Ultra shallow tip 214 preferably extends at least 100 Å beneath (laterally) gate electrode 204 and preferably 500 Å for a transistor with an effective gate length of approximately 0.10 microns (or 1000 Å) and a drawn gate length of 0.2 μm. Additionally, ultra shallow tip 214 preferably extends less than 1000 Å deep into substrate 201 beneath substrate surface 203 for a 0.10 μm effective gate length. It is to be appreciated that because novel methods of fabrication are employed in the present invention, ultra shallow tip 214 can be characterized by a very abrupt junction.

Tip 210 of transistor 200 also includes a raised tip portion 216. Raised tip portion 216 is located beneath second sidewall spacer 208 and is adjacent to the outside edges of first sidewall spacer 206. Raised tip 216 is preferably formed of doped semiconductor material 217 selectively deposited both above and below surface 203 of semiconductor substrate 201. Raised tip portion 216 also includes a portion 215 doped by "out diffusing" dopants from selectively deposited semiconductor material 217 into substrate 201. Because a portion of raised tip 216 is formed above semiconductor substrate surface 203, raised tip 216 is said to be "raised". A raised tip significantly reduces the parasitic resistance of transistor 200 and thereby improves its performance.

A pair of source/drain contact regions 212 are formed adjacent to the outside edge of second sidewall spacer 208. Source/drain contact regions 212 comprise selectively deposited semiconductor material 217 and "out diffused" doped semiconductor substrate 215. Source/drain contact regions 212 are partially raised source/drain regions. Silicide 218 is preferably formed on source/drain regions 212 in order to reduce the contact resistance of transistor 200. Additionally, according to the present invention, first semiconductor material 217 is preferably deposited onto the top surface of gate electrode 204. Silicide 218 is also preferably formed on deposited semiconductor material 217 on gate electrode 204 to help improve contact resistance. Additionally, if desired, source/drain contact regions 212 can be made into deep junction source/drain contacts by ion implanting or diffusing additional dopants into a region 220 in substrate 201 in alignment with the outside edges of second sidewall spacers 208.

It is to be appreciated that a valuable feature of the present invention is the fact that transistor 200 includes a tip or source/drain extension 210 which is both ultra shallow and raised. In this way, transistor 200 has a shallow tip with a very low parasitic resistance. The novel structure of transistor 200 allows for tip scaling necessary for the fabrication of transistor 200 with effective gate length less than 0.12 µm. Because of the novel tip structure 210 of the present invention, transistor 200 has good punchthrough performance and reduced $V_T$ roll-off. Additionally, because of tip 210, transistor 200 has a low parasitic resistance, resulting in good drive current.

The present invention describes several methods of integrating the fabrication of a transistor with a low resistance ultra shallow tip into a CMOS process (i.e. into a process where both n-type and p-type transistors are formed).

According to a first preferred method of the present invention, as illustrated in FIGS. 3a–3h, a PMOS transistor having a low resistance ultra shallow tip is fabricated with a conventional NMOS transistor. According to the preferred method of the present invention, a silicon substrate 300 is provided. A plurality of field isolation regions 305 are formed in substrate 300 to isolate wells of different conductivity types and to isolate adjacent transistors. Field isolation regions 305 are preferably shallow trench isolation (STI) regions formed by etching a trench into substrate 300 and then filling the trench with a deposited oxide. Although STI isolation regions are preferred because of their ability to be formed to small dimensions with a high degree of planarity, other methods can be used such as, but not limited to, LOCOS, recessed LOCOS, or silicon on insulator (SOI), and suitable insulators, other than oxides, such as nitrides may be used if desired.

Silicon substrate 300 includes a first region 302 of p-type conductivity in the range of $1\times10^{17}/cm^3$–$1\times10^{19}/cm^3$ and a second region 304 of n-type conductivity in the range of $1\times10^{17}/cm^3$–$1\times10^{19}/cm^3$. According to the preferred embodiment, n-type conductivity region 304 is a n-well formed by a first implant of phosphorous atoms at a dose of $4\times10^{13}/cm^2$ and an energy of 475 keV, a second implant of phosphorous atoms at a dose of $2.5\times10^{12}/cm^2$ at an energy of 60 keV, and a final implant of arsenic atoms at a dose of $1\times10^{13}/cm^2$ at an energy of 180 keV into a silicon substrate 300 having a concentration of $1\times10^{16}/cm^3$ in order to produce a n-well 304 having a n-type concentration of approximately $7.0\times10^{17}/cm^3$. Additionally, according to the preferred embodiment of the present invention, p-type conductivity region 302 is a p-well formed by a first implant of boron atoms at a dose of $3.0\times10^{13}/cm^2$ at an energy of 230 keV followed by a second implant of boron ions at a dose of $4.2\times10^{13}/cm^3$ and an energy of 50 keV into substrate 300 in order to produce a p-well 302 having a p-concentration of $7.0\times10^{17}/cm^3$. It is to be appreciated that p-type conductivity region 302 and n-type conductivity 304 may be formed by other means including providing an initially doped substrate, or depositing an insitu doped semiconductor material with a desired conductivity. According to the present invention, a substrate is defined as the starting material on which the transistors of the present invention are fabricated and includes p-well 302 and n-well 304.

Figure 3A:
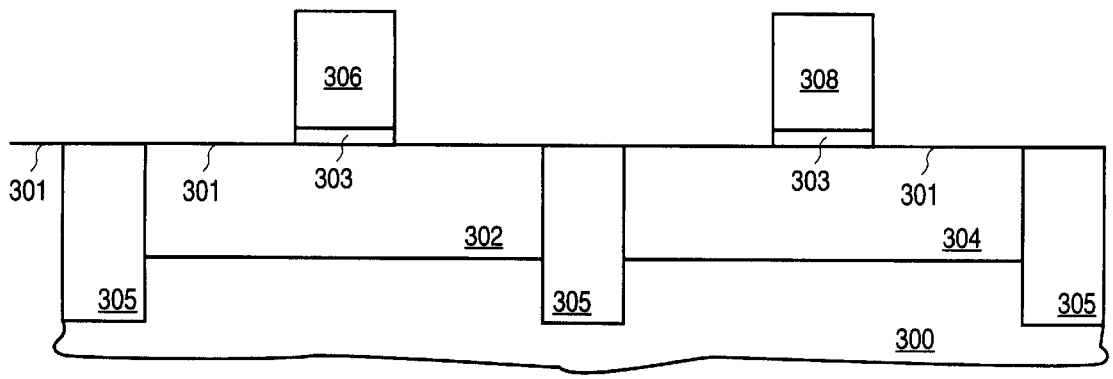
FIG. 3a is an illustration of a cross-sectional view of the formation of a first gate electrode on a p-well and the formation of a second gate electrode on a n-well.

According to the present invention, a first gate dielectric layer 303 is formed on the top surface 301 of substrate 300 as shown in FIG. 3a. Gate dielectric layer 303 is preferably a nitrided oxide layer formed to a thickness of between 20–50 angstroms (Å). It is to be appreciated that other well known gate dielectric layers such as oxides, nitrides, and combinations thereof may be utilized if desired. Next, a gate electrode 306 is formed over gate dielectric layer 303 formed over p-well 302 and a gate electrode 308 is formed over gate dielectric layer 303 formed over n-well 304. Gate electrodes 306 and 308 are preferably formed from a 1000–3500 Å thick layer of blanket deposited polysilicon patterned into gate electrodes 306 and 308 with well known photolithographic techniques. If desired, the polysilicon layer can be ion implanted to the desired conductivity type and level prior to patterning.

It is to be appreciated that other well known patterning techniques may be utilized to pattern the polysilicon layer into gate electrodes 306 and 308 including submicron lithography techniques, such as e-beam and x-ray, and subphotolithographic patterning techniques such as described in U.S. Pat. No. 5,434,093 entitled "Inverted Spacer Transistor" and assigned to the present Assignee. According to the presently preferred method of the present invention, polysilicon gate electrodes 306 and 308 preferably have a drawn length of approximately 0.2 µm (i.e. 2000 Å). Additionally, although gate electrodes 306 and 308 are preferably polysilicon gate electrodes, gate electrodes 306 and 308 can be, but are not limited to, metal gates, a single crystalline silicon gate, or any combination thereof, if desired.

Figure 3B:
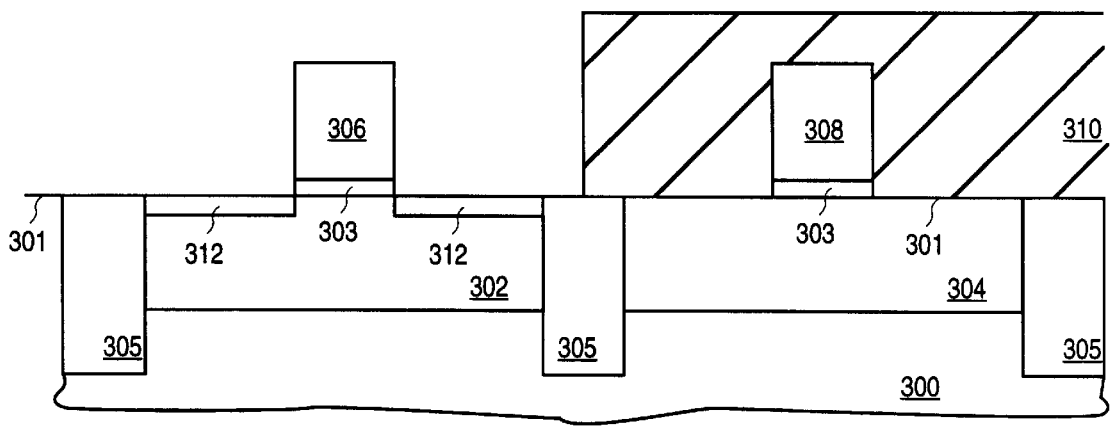

Next, as shown in FIG. 3b, substrate 300 is covered with a photoresist layer. The photoresist layer is then patterned with well known photolithography techniques to form a photoresist mask 310 which exposes p-well 302 and masks n-well 304. Next, n-type conductivity ions are implanted into substrate 300 to form conventional N– tip regions 312 in alignment with the outside edges of gate electrode 306. Gate electrode 306 prevents the region beneath gate electrode 306 from being implanted with ions. Additionally, photoresist mask 310 prevents n-well 304 from being doped by the N− tip implant. N− tip regions 312 preferably have a concentration in the range of approximately $1 \times 10^{18} - 1 \times 10^{19}/cm^3$. N− tip regions 312 can be formed by ion implanting arsenic atoms at a dose of $1 \times 10^{15}/cm^2$ and an energy of 10 keV. (It is to be appreciated that N− tip regions 312 will diffuse laterally beneath gate electrode 306 during a subsequent RTP annealing process.) Next, photoresist mask 310 is removed by well known techniques.

Figure 3C:
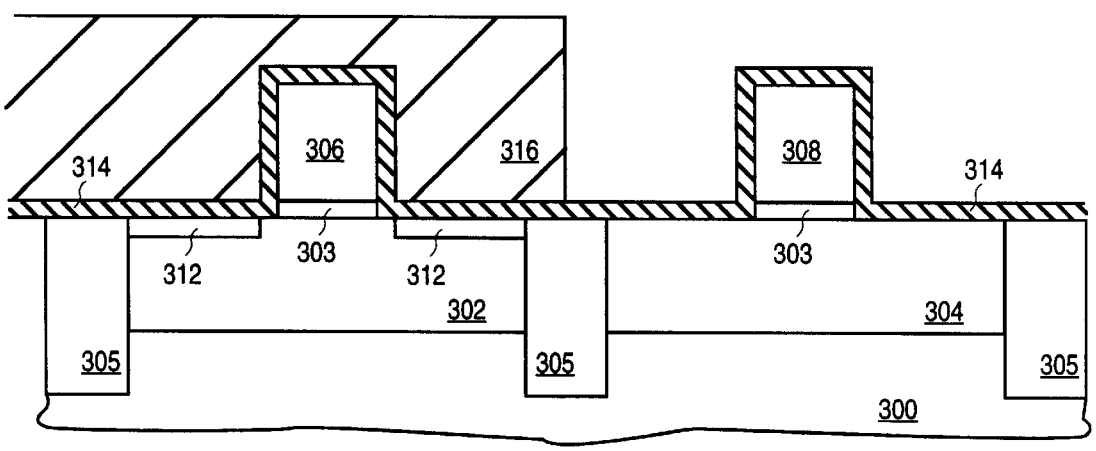
FIG. 3c is an illustration of a cross-sectional view of the formation of a silicon nitride layer over the substrate of FIG. 3b.

Next, as shown in FIG. 3c, a silicon nitride layer 314 is formed over substrate 300 including p-well 302, the top and sides of gate electrode 306, n-well 304 and the top and sides of gate electrode 308. Silicon nitride layer 314 is formed to a thickness of between 50–500 Å with approximately 150 Å being preferred. It is to be appreciated that silicon nitride layer 314 must be formed thick enough to electrically isolate a subsequently deposited semiconductor material from gate electrode 306. Additionally, the thickness of silicon nitride layer 314 defines a resulting spacer thickness and thus the minimum length of ultra shallow tip portion of the fabricated PMOS transistor.

Silicon nitride layer 314 is preferably formed by a "hot-wall" process to provide a very hermetic seal of gate electrodes 306 and 308, and the edges of gate dielectric 303. By forming silicon nitride layer 314 directly onto gate electrode 306 and 308, a hermetic seal is formed and the hot electron lifetime of the fabricate transistors dramatically improved. (It is to be appreciated that a native monolayer of oxide can incidentally form on gate electrodes 306 and 308 prior to deposition of silicon nitride layer 314. Such a monolayer of oxide does not affect the integrity of the hermetic seal of silicon nitride layer 314 and is considered unimportant to the present invention.) Additionally, although a hot wall silicon nitride layer is preferred in the present invention because of the hermetic seal it forms, any other suitable insulating layer, such as a deposited oxide, can be used if desired.

Silicon nitride layer 314 can be formed by a low pressure chemical vapor deposition (LPCVD) process by reacting ammonia ($NH_3$) and dichlorosilane (DCS) at a pressure of approximately 10 pascals and at a temperature of approximately 800° C.

Next, a photoresist layer is blanket deposited over substrate 300. The photoresist layer is then masked, exposed and developed with well known photolithographic techniques to form a photoresist mask 316 over p-well 302, and to reveal n-well 304 as shown in FIG. 3c.

Figure 3D:
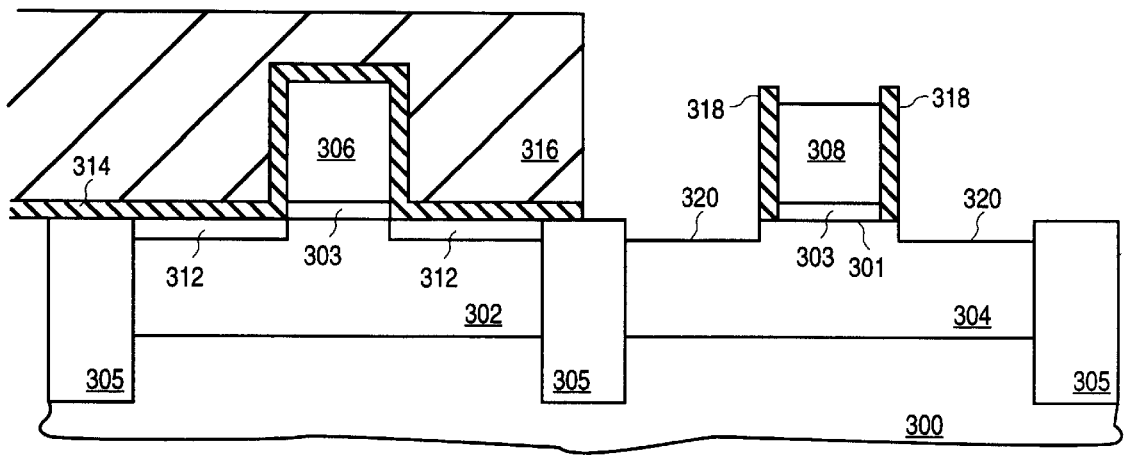
FIG. 3d is an illustration of a cross-sectional view showing the formation of a first pair of sidewall spacers on opposite sides of a gate electrode formed on a substrate and the formation of recess regions in the n-well of the substrate of FIG. 3c.

Next, as shown in FIG. 3d, silicon nitride layer 314 formed over n-well 304 and gate electrode 308 is antisotropically dry etched to form a first pair of silicon nitride spacers 318. It is to be appreciated that silicon nitride layer 314 over p-well 302 and gate electrode 306 remains unetched because it is protected by photoresist mask 316.

According to the first preferred method of the present invention after silicon nitride layer 314 has been removed from n-well 304, the antisotropic etch is continued to form a pair of recesses 320 in n-well 304 in alignment with the outside edges of the first pair of silicon nitride spacers 318. It is to be noted that the top surface of polysilicon gate electrode 308 is also etched during the silicon substrate recess etch. Gate electrode 308 and the first pair of nitride spacers 318 act as a mask preventing substrate surface 301 located underneath from being etched. In this way, the recess etch of the present invention is self-aligned to the outside edges of first silicon nitride spacers 318. According to the preferred embodiment of the present invention, n-well 304 is etched to form recesses 320 with a depth of between approximately 20–1000 Å with a depth of 200 Å below substrate surface 301 being preferred. It is to be appreciated that the depth of recesses 320 defines the minimum depth at which the fabricated PMOS transistor's ultra shallow tips will extend into n-well 304. The deeper the recesses 320, the deeper the PMOS transistor's tip regions will extend in n-well 304.

According to the first preferred method of the present invention, silicon nitride spacers 318 and recesses 320 are formed insitu (i.e. in the same etch chamber) using a chemistry comprising $C_2F_6$ and a power of approximately 200 watts. According to the preferred method of the present invention, the power is reduced from approximately 700 mtorr to approximately 500 mtorr after silicon nitride layer 314 has been removed from the surface 301 of n-well 304 and recesses 320 begin to etch.

Figure 3E:
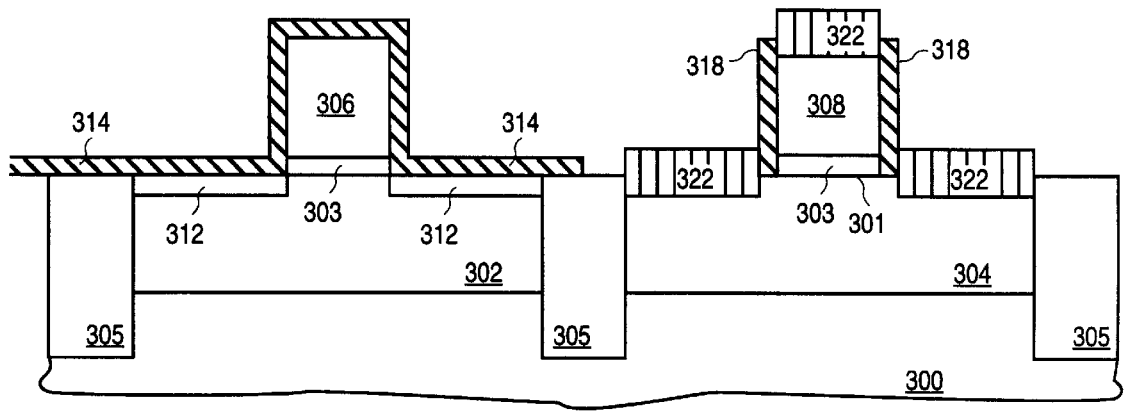
FIG. 3e is an illustration of a cross-sectional view showing the deposition of semiconductor material on the substrate of FIG. 3d.

Next, as shown in FIG. 3e, photoresist mask 316 is removed from p-well 302 with well known techniques. Next, according to the first preferred method of the present invention, as shown in FIG. 3e, a semiconductor material 322 is selectively deposited into recesses 320 and onto the top surface of gate electrode 308. Semiconductor material 322 is selectively deposited so that if forms only on exposed silicon such as n-well 304 and the top of polysilicon gate electrode 308. Because silicon nitride layer 314 covers p-well 302 and gate electrode 306, no semiconductor material is deposited onto p-well 302 and gate electrode 306. Additionally, no semiconductor material is deposited onto silicon nitride spacers 318. Silicon nitride spacers 318 electrically isolate semiconductor material 322 formed in recesses 320 from gate electrode 308. Semiconductor material 322 is formed to a thickness of between 200–2000 Å with approximately 800 Å being preferred. In this way, semiconductor material 322 is formed both above and below surface 301 of semiconductor substrate 300. By forming semiconductor material 322 above substrate surface 301, a "raised" tip is formed which increases the conductivity of the tip which in turn improves device performance. By forming raised tip regions in the present invention, shallow tips can be formed and good punchthrough characteristics obtained. Additionally, semiconductor material 322 is preferably silicon-germanium insitu doped with p-type impurities to a concentration level between $1 \times 10^{18}/cm^3 - 5 \times 10^{20}/cm^3$ with a concentration of approximately $1 \times 10^{20}/cm^3$ being preferred.

According to the present invention, semiconductor material 320 is preferably a silicon-germanium semiconductor alloy with germanium comprising approximately 10–50% of the alloy. A silicon-germanium semiconductor alloy can be formed by a decomposition of approximately 20 sccm of dichlorosilane ($SiH_2Cl_2$), approximately 130–180 sccm of 1% hydrogen diluted germanium ($GeH_4$), and a p-type dopant source of approximately 5–100 sccm of 1% hydrogen diluted diborane ($B_2H_6$), at a temperature of between 600°–800° C. with 700° C. being preferred and a power of approximately 20 torrs. In order to increase the selectivity of the deposition process, approximately 25–50 sccm of HCl can be added to the gas composition if desired. A silicon-germanium semiconductor material is preferred because it exhibits good selectivity to silicon during deposition. Additionally, such a silicon-germanium semiconductor alloy exhibits many microscopic "faults" and "dislocations" which aid in the solid state diffusion of dopants through the semiconductor material.

It is to be appreciated that any semiconductor material which can be selectively deposited can be used to form semiconductor material 322. For example, semiconductor material 322 can be selectively deposited polycrystalline silicon formed from dichlorosilane and HCl in an $H_2$ ambient, at a temperature between 600–900° C. or can be selectively deposited single crystalline silicon formed by any well known technique. Prior to the selective deposition of semiconductor material 322, one can utilize a 600°–900° C. bake in an $H_2$ ambient to remove native oxides from the exposed silicon/polysilicon areas.

It is to be appreciated that the thickness and doping concentration level of semiconductor material 322 determines the resistivity of the raised tip portion of the fabricated PMOS transistor. A thicker and higher doped semiconductor material 322 results in a transistor with lower parasitic resistance. An adverse capacitance (i.e. Miller capacitance) however, can be developed when opposite voltages are placed on gate electrode 308 and semiconductor material 322. The higher the doping and the thicker the semiconductor material 322 is, the greater is the Miller capacitance. Thus, a trade off must be made between the transistor's parasitic resistance and its Miller's capacitance.

Figure 3F:
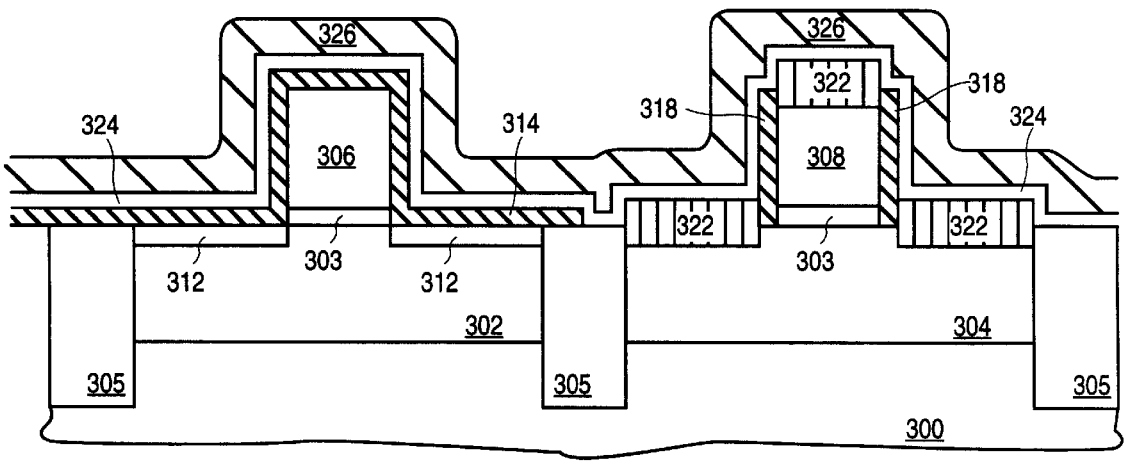
FIG. 3f is an illustration of a cross-sectional view showing the formation of an oxide layer and a silicon nitride layer over the substrate of FIG. 3e.

Next, as shown in FIG. 3f, a thin, approximately 50–100 Å, chemical vapor deposited (CVD) oxide layer 324 is blanket deposited over substrate 300. Oxide layer 324 is conformally deposited over silicon nitride layer 314 formed over p-well 302 and gate electrode 306, and over semiconductor material 322 and silicon nitride spacers 318 formed on n-well 304. Oxide layer 324 can be formed by any well known CVD process. It is preferred however, to keep the deposition temperature below 750° C. so that the thermal energy does not disturb the implanted N− tip regions 312. An oxide deposition temperature of approximately 650° C. is preferred. Next, a substantially thicker, 500–1800 Å with 800 Å being preferred, CVD silicon nitride layer 326 is blanket deposited onto oxide layer 324. Silicon nitride layer 326 is preferably formed by a standard CVD "hot-wall" process at a temperature below 750° C. and temperature of 700° C. being ideal. By keeping the silicon nitride deposition temperature relatively low, the thermal budget is kept down and the deposition rate and uniformity made more controllable. Oxide layer 324 buffers the large stress inherent in silicon nitride layer 326.

Next, silicon nitride layer 326, oxide layer 324, and silicon nitride layer 314 over p-well 302 are antisotropically etched to form a pair of composite spacers 328 adjacent to gate electrode 306 and a pair of composite spacers 330 adjacent to the first pair of silicon nitride spacers 318. Thus, novel fabricated PMOS device is characterized by having two sets of spacers, a first pair of thin silicon nitride spacers 318, and a second pair of thicker composite sidewall spacers 330, comprising silicon nitride layer 326 and oxide layer 324. Additionally, the fabricated NMOS transistor includes a pair of novel composite spacers 328 adjacent to gate electrode 306 comprising silicon nitride layer 326 and oxide layer 324, formed on and adjacent to, silicon nitride layer 314. It is to be appreciated that silicon nitride layer 326 of composite sidewall spacers 328 and 330 help to further hermetically seal the fabricated transistors of the present invention.

Figure 3G:
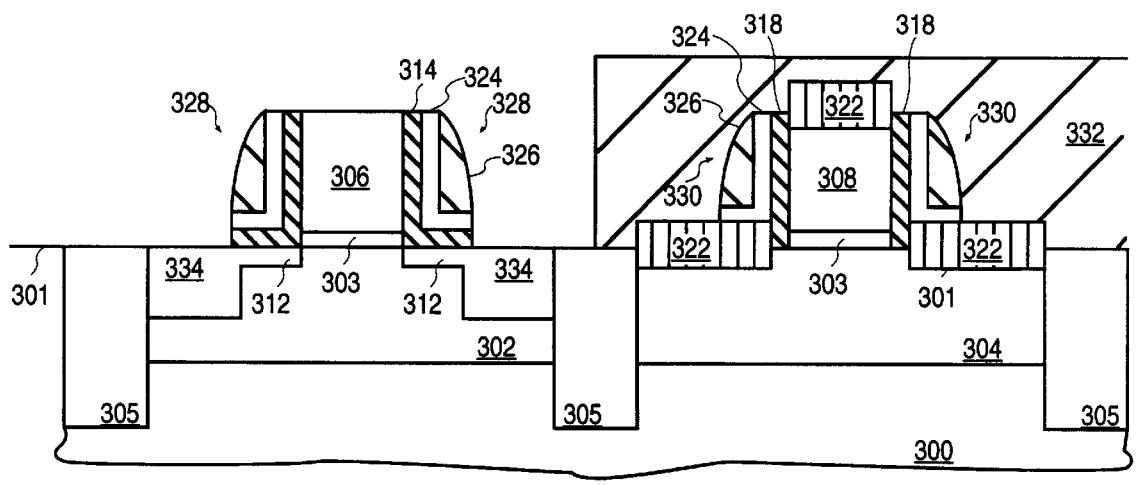
FIG. 3g is an illustration of a cross-sectional view showing the formation of a first pair of sidewall spacers adjacent to the first gate electrode and a second pair of sidewall spacers adjacent to the first pair of silicon nitride spacers on the substrate of FIG. 3f.

Next, a photoresist layer is formed over substrate 300. The photoresist layer is then masked, exposed, and developed to uncover p-well 302 and to form a photoresist mask 332 over n-well 304, as shown in FIG. 3g. Next, substrate 300 is subjected to an N+ implant to form N+ source/drain contact regions 334 in p-well 302. Any well known ion implantation technique can be used to implant n-type conductivity impurities, such as arsenic or phosphorous, to form source/drain contact regions 334 with a N+ conductivity level of between $1\times10^{19}/cm^3$–$5\times10^{20}/cm^3$ and a depth of approximately 0.15–0.25 micrometers. Additionally, the ion implantation step can be used to dope polysilicon gate electrode 306 to an N+ conductivity, if not previously doped during polysilicon gate electrode formation. In this way, gate electrode 306 has the same conductivity type as source/drain regions 334. It is to be appreciated that the first composite sidewall spacer 328 must be formed thick and wide enough to provide a sufficient mask to prevent the deep, high dose ion implantation of the source/drain contact region 334 from overwhelming the N− region 312.

Figure 3H:
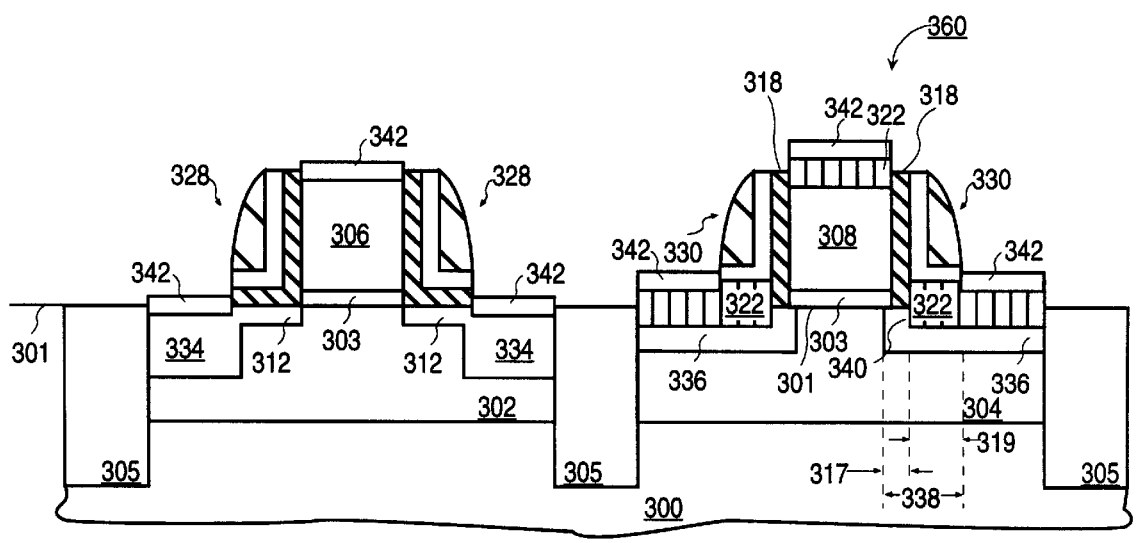
FIG. 3h is an illustration of a cross-sectional view showing the formation of silicide in the source/drain contact regions and on the deposited semiconductor material of FIG. 3g.

Next, as shown in FIG. 3h, photoresist mask 332 is removed with any well known technique. Next, according to the present invention as shown in FIG. 3h, p-type impurities or dopants are diffused out from semiconductor material 322 and into n-well 304 to form diffused semiconductor regions 336. The out diffusion of impurities from semiconductor material 322 forms diffused semiconductor region 336 with a concentration level approximately equal to the deposited semiconductor material 322. Impurities are diffused laterally (horizontally) beneath the first thin silicon nitride spacers 318 until impurities extend at least 100 Å (laterally) beneath the outside edges of a gate electrode 308 and preferably extend 500 Å (laterally) beneath gate electrode 308. The portion of diffused semiconductor regions 336 which laterally extend beneath the first pair of silicon nitride spacers 318 and gate electrode 308 is the ultra shallow tip portion 317 of tip region 338 of the PMOS transistor. It is to be appreciated that the out diffusion of impurities also diffuses impurities deeper (i.e. vertically) into n-well 304. For each 150 Å of lateral diffusion, dopants diffuse about 150 Å vertically into p-well 304. Thus, according to the preferred embodiment of the present invention, ultra shallow tips 317 are approximately 650 Å in length and approximately 850 Å deep to provide an approximately 0.1 micron effective gate length for a drawn gate electrode length of approximately 2000 Å (0.2 $\mu$m). Additionally, PMOS transistor 360 has a tip 338 with a raised portion 319 comprising semiconductor material 322 and diffusion doped semiconductor 336.

According to the preferred embodiment of the present invention, an anneal using a Rapid Thermal Process (RTP) is utilized to diffuse impurities from semiconductor material 322 into n-well 304 and form diffusion doped semiconductor regions 336. According to the preferred RTP of the present invention, a two step rapid thermal annealing is used. In the first step, substrate 300 is heated to a temperature of approximately 500°–700° C., with 600° C. preferred in an ambient comprising approximately 5–10% $O_2$, with 10% $O_2$ preferred, and 95–80% $N_2$, with 90% $N_2$ preferred, for approximately 20–60 seconds, with 30 seconds preferred. Because oxygen is included in the ambient during the first step of the RTP, a thin oxide capping layer (not shown) is formed on semiconductor material 322 and source/drain contact regions 334. The thin oxide capping layer prevents dopant loss (i.e. out diffusion of dopants into the ambient) during the anneal. In this way, the doping concentrations of the source/drain regions can be accordingly controlled and low parasitic resistance regions formed. Additionally, it is to be noted that the first RTP step also forms a thin capping layer on exposed gate electrode 306 and semiconductor material 322 on gate electrode 308 which prevents dose loss and resultant "poly depletion" effects in the fabricated transistors. After completion of the first step of the RTP anneal, the ambient is changed to 100% $N_2$ and annealing continued for an additional 10–40 seconds, with 20 seconds preferred, at a temperature in the range of 850°–1500° C., with 950° C. preferred. The second step of the RTP causes the diffusion of impurities from semiconductor material 322 into substrate 300 and the resultant formation of source/drain junctions. It is to be appreciated that the two steps of the RTP anneal of the present invention preferably occur insitu (i.e. the second anneal step is done serially with and in the same chamber as the first anneal step). Additionally, any well known rapid thermal annealing equipment, such as but not limited to, an AG Associates Rapid Thermal Processor, can be utilized to conduct the RTP anneal of the present invention.

It is to be noted that a novel aspect of the present invention is that the RTP anneal process of the present invention is the only front end (prior to silicide formation) high temperature process used to activate and drive all of the implants and impurity diffusions in the present invention. That is, the p-well, n-well, tip, and source/drain implants and solid state diffusion are all activated and driven by the single RTP anneal process of the present invention. No other high temperature furnace anneals are utilized in the present invention to drive/activate the implanted regions and drive dopant diffusion. In this way, the thermal budget in the present invention is kept very low and controllable.

It is to be appreciated that a key feature of the present invention is the fact that the semiconductor material 322 is formed beneath semiconductor substrate surface 301. That is, in the present invention a source of dopants 340 is placed into n-well 304 directly adjacent to the location where the ultra shallow tip 317 is to be formed. In this way, during the solid state diffusion step, dopants are able to easily diffuse from semiconductor material 322 in a single direction (laterally) below the first silicon nitride spacers 318 and underneath the outside edge of polysilicon gate electrode 308. This results in a ultra shallow tip 338 which is characterized by a very sharp and adrupt junction with n-well 304. Such an adrupt junction improves the punchthrough characteristics of the fabricated PMOS transistor. Additionally, it is to be appreciated that by forming ultra shallow tips 338 by solid state diffusion, higher conductivity tips can be fabricated than possible with present standard ion implantation techniques. A higher concentration tip region improves the device performance and lowers the parasitic resistance of the device.

It is to be noted that recesses are not required in the present invention in order to form and adequately performing transistor. Recesses are preferred because they allow the formation of a very adrupt tip/substrate junction which results in a device with excellent punchthrough characteristics. If desired, however, semiconductor material can be placed directly onto the top surface 301 of substrate 300, and dopants diffused in two directions (horizontally and vertically) to form tip regions 338. Although such a fabricated transistor would not possess the superior performance characteristics of a transistor with recess regions, the performance is adequate to provide a reliable transistor.

Additionally, at this time if desired, a protective mask can be formed over the NMOS transistor over p-well 302 and a high concentration p-type implant made into semiconductor material 322 in alignment with the outside edges of composite spacers 330 in order to further increase the doping concentration level of the source/drain contact regions of the PMOS transistor and gate electrode 308. The additional implant is only necessary if the doping concentration of insitu doped semiconductor material is not doped sufficiently high.

Next, according to the preferred method of the present invention, silicide 342 is formed by a self-aligned silicide process (salicide) onto deposited semiconductor material 322 adjacent to the outside edges of composite spacers 330 and on semiconductor material 322 formed on the top of gate electrode 308. Additionally, silicide 342 is formed on the N+ source/drain contact regions 334 formed in p-well 302 and on the top of gate electrode 306. In the preferred salicide process, a titanium layer is first blanket deposited over the entire substrate 300. The device is then temperature cycled to cause a reaction between the deposited titanium layer and any exposed silicon surfaces (i.e. semiconductor material 322 on gate electrode 308 and semiconductor material on source and drain contact regions 344 and on N+ source/drain contact regions 334 and gate electrode 306) to form titanium silicide 340 (i.e. TiSiX). It is to be appreciated that titanium does not react with the composite sidewall spacers 328 and 330. Next, a selective etch is used to remove the unreacted titanium from the composite sidewall spacers 328 and 330 and leave titanium salicide 342. It is to be appreciated that other refractory metals, such as tungsten, can be used to form silicide 342. Additionally, it is to be noted that the sidewall spacers 328 and 330 must be formed thick enough to prevent silicide encroachment from electrically shorting the gate electrode to the source/drain contact regions. Additionally, it is to be appreciated that silicide can be selectively deposited onto exposed silicon surfaces instead of using the described salicide process, if desired.

After completion of the silicide process, the first preferred method of fabricating a novel PMOS transistor 360 having a low resistance ultra shallow tip region, and a conventional NMOS transistor is now complete. Conventional and well known processes can now be utilized to interconnect the various transistors formed in substrate 300 into a functional circuit such as a microprocessor or memory device.

A second preferred method of integrating a novel transistor with a conventional transistor in a CMOS process is described and illustrated with respect to FIGS. 4a–4f. The second preferred method of the present invention will be described with respect to the formation of a conventional NMOS device and a novel PMOS device.

According to the second preferred method of the present invention, a semiconductor substrate having a p-type region 302, a gate dielectric 303, a first gate electrode 306, a n-type region 304, a second gate electrode 308 and isolation regions 305, such as substrate 300 shown and described with respect to FIG. 3a is provided.

Figure 4A:
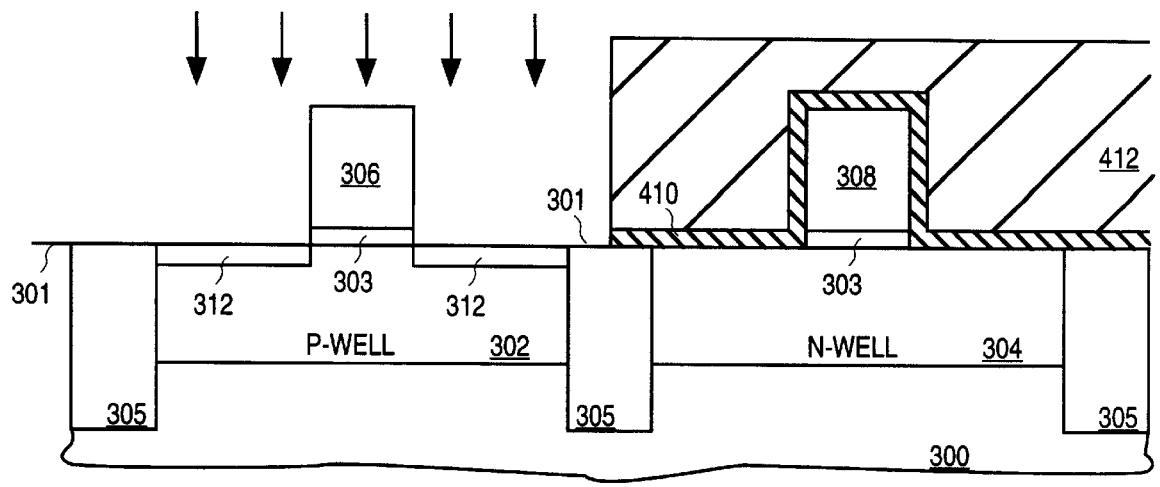

Next, as shown in FIG. 4a, a boron doped glass layer 410 is blanket deposited over semiconductor substrate 300 including p-well 302, gate electrode 306, n-well 304, and gate electrode 308. Boron doped glass layer 410 is formed to a thickness of between 50–200 Å and has a boron concentration in the range of 1–6% atomic volume and a preferred concentration of 2% atomic volume. Boron doped glass layer 410 can be formed by chemical vapor deposition utilizing source gases of approximately, 300 sccms of triethylborate (TEB), 3300 sccms of tetraethylorthosilicate (TEOS) and 5000 sccms of 12/88 weight percent of $O_3/O_2$ at 500° C. Next, a photoresist mask 412 is formed over n-well 304 with well known photolithographic techniques. Boron doped glass layer 410 is then removed from over p-well 302 and gate electrode 306 as shown in FIG. 4a. Boron doped glass layer 410 can be removed from p-well 302 with a dip in a 1:1 HF solution (Hydrofluoric acid) or BOE (0.10% HF, 17% $NH_4F$, 82.9% Di water), or any other suitable etchant. Next, N− tip regions 312 are formed in p-well 302 in alignment with gate electrode 306 as described above. After the formation of N− tip regions 312, photoresist mask 412 is stripped with well known techniques.

Figure 4B:
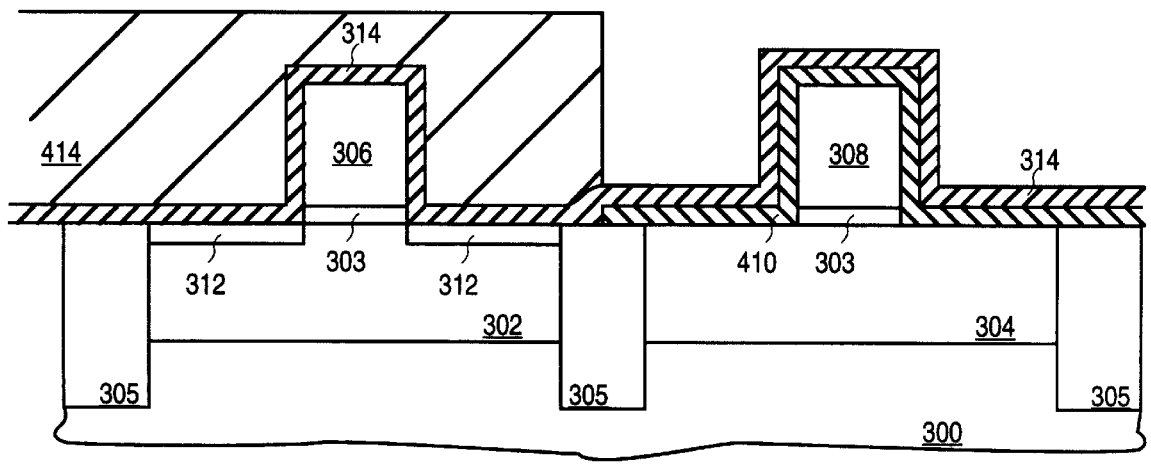

Next, a hot-wall silicon nitride layer 314 is blanket deposited over substrate 300 including p-well 302, gate electrode 306 and boron doped glass layer 410 over n-well 304. Again, although a hot-wall silicon nitride layer is preferred, it is not required, and any suitable insulating layer can be used if desired. Hot-wall silicon nitride layer is preferred in order to provide a hermetic seal of gate electrodes 306 and 308 and the edges of gate oxide layer 303 to thereby reduce hot electron effects of the fabricated transistor. Next, as shown in FIG. 4b, a photoresist mask 414 is formed over p-well 302 including gate electrode 306 with well known photolithography techniques.

Figure 4C:
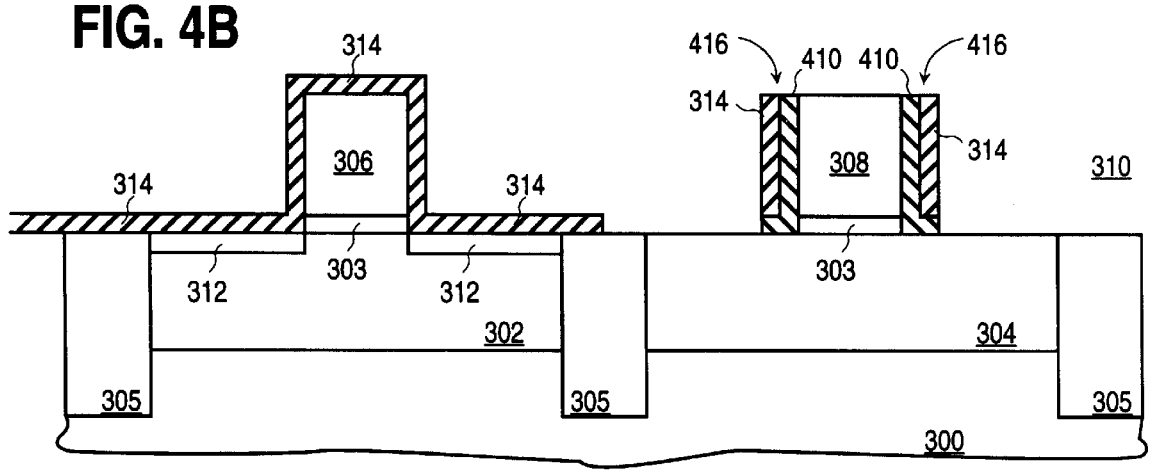
FIG. 4c is an illustration of a cross-sectional view showing the formation of a first pair of composite sidewall spacers adjacent to the gate electrode over the n-well of the substrate of FIG. 4b.

After the formation of photoresist mask 414, substrate 300 is exposed to an antisotropic etch to form a first pair of composite sidewall spacers 416 comprising silicon nitride layer 314 and boron doped glass layer 410. Photoresist mask 414 prevents silicon nitride layer 314 located over p-well 302 from being etched. The first pair of composite sidewall spacers 416 adjacent to gate electrode 308 can be formed by reactive ion etching with a chemistry comprising $C_2F_6$ and helium with a power of 200 watts and a pressure of approximately 700 mtorr. After the formation of the first pair of composite sidewall spacers 416 adjacent to gate electrode 308, photoresist mask 414 is stripped with well known techniques, as shown in FIG. 4c.

Figure 4D:
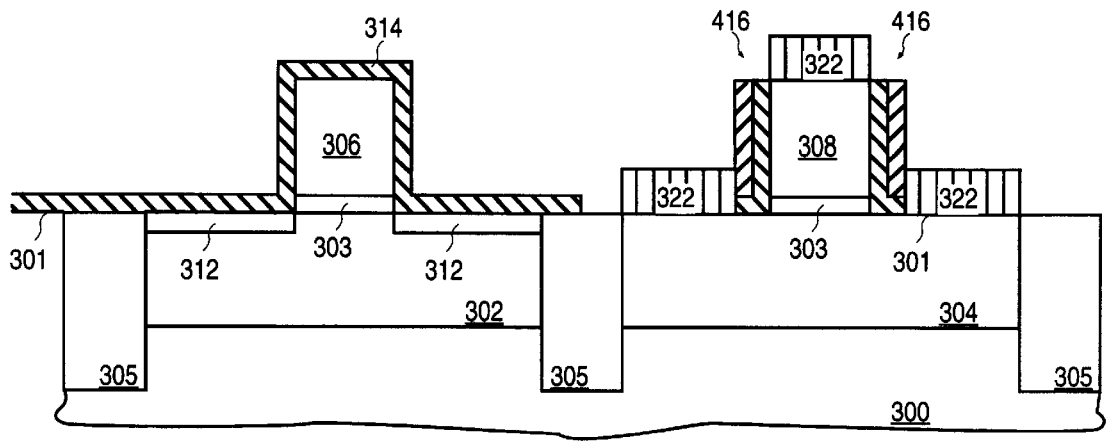
FIG. 4d is an illustration of a cross-sectional view showing the formation of semiconductor material on the substrate of FIG. 4c.

Next, as illustrated in FIG. 4d, an insitu doped semiconductor material 322 is selectively deposited onto the first surface 301 of silicon substrate 300 over n-well 304 and on the top of gate electrode 308. Silicon nitride layer 314 prevents the selective growth of semiconductor material over p-well 302 and gate electrode 306. Semiconductor material 322 is preferably a boron insitu doped silicon germanium alloy formed to a thickness and concentration level and by a method described above. Next, a thin CVD oxide layer 324 and a thicker hot-wall silicon nitride layer 326 are blanket deposited over substrate 300 as described above. Thin CVD oxide layer 324 and silicon nitride layer 326 are then antisotropically etched as described above to form a first pair of composite sidewall spacers 328 adjacent to gate electrode 306 and a second pair of composite sidewall spacers 330 adjacent to the first pair of composite sidewalls pacers 416 as shown in FIG. 4e.

Figure 4E:
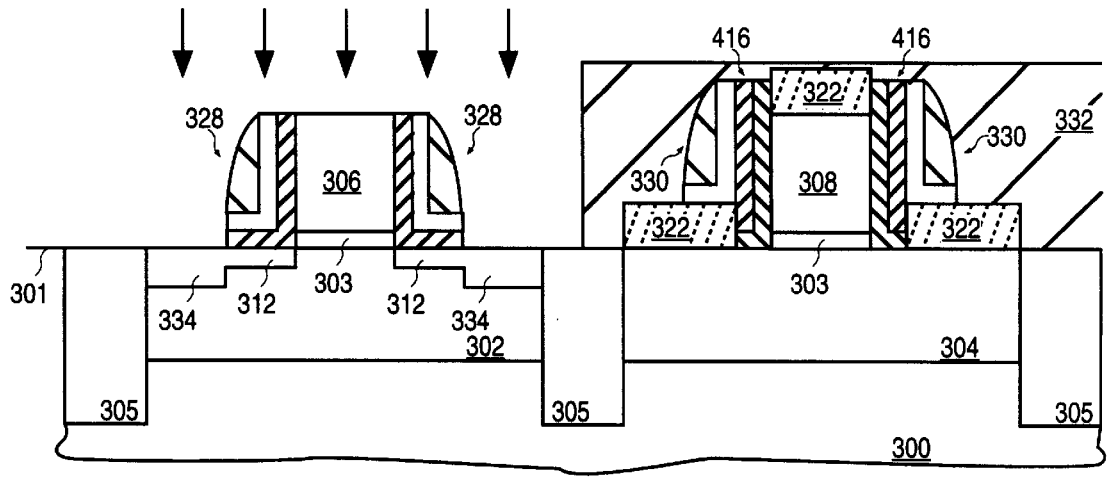
FIG. 4e is an illustration of a cross-sectional view showing the formation of a first pair of spacers adjacent to the gate electrode formed over the p-well and the formation of a second pair of spacers adjacent to the first pair of composite spacers formed adjacent to the gate electrode over the n-well of the substrate of FIG. 4d.

Next, as shown in FIG. 4e, a photoresist mask 332 is formed over n-well 304 with well known photolithography techniques. Substrate 300 is then subjected to an N+ ion implantation to form N+ source/drain contact regions 334 in p-well 302 in alignment with the outside edges of composite spacers 328 and to dope gate electrode 306 as discussed earlier. It is to be appreciated that photoresist mask 332 prevents n-well 304 from being implanted by the N+ ion implantation step.

Figure 4F:
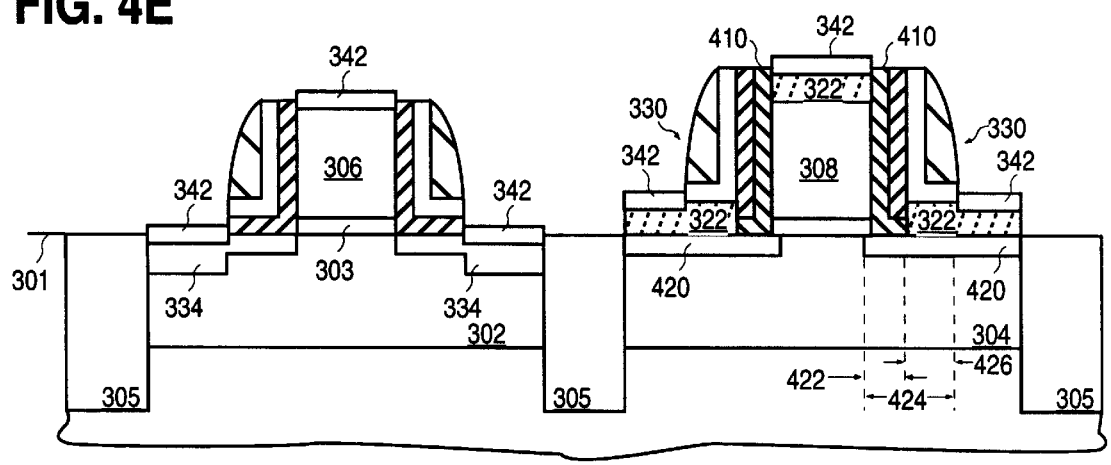
FIG. 4f is an illustration of a cross-sectional view showing the out diffusion of impurities from deposited semiconductor material and the formation of silicide on the substrate of FIG. 4e.

Next, as shown in FIG. 4f, photoresist mask 332 is stripped by well known techniques. After photoresist mask 332 is removed, substrate 300 is subjected to the RTP anneal of the present invention to drive boron dopants from semiconductor material 322 and from boron doped silicon glass layer 410 into n-well 304 to form diffused regions 420 as shown in FIG. 4f. It is to be appreciated that boron doped glass layer 410 of first composite spacer 416 provides a source of dopants for the formation of the ultra shallow portion 422 of tip region 424. Boron doped silica glass alleviates the need for the formation of recesses in order to form an adrupt tip/substrate junction in the second preferred method of the present invention. Additionally, the raised portion 426 of tip region 424 is formed from semiconductor material 322 and from diffused region 420 formed by diffusing dopants from semiconductor material 322. In this way, the PMOS transistor of the second preferred method of the present invention is characterized by having a tip 424 with a shallow tip portion 422 and a raised tip portion 426 as shown in FIG. 4f. It is to be noted that the RTP anneal of the present invention also diffuses dopants from semiconductor material 322 formed on the top of gate electrode 308 into gate electrode 308 in order to dope gate electrode 308. In this way, gate electrode 308 takes on the same conductivity type as the source/drain regions. Additionally, the RTP anneal of the present invention is utilized to activate all of the prior implants such as the n-well implants, the p-well implants, the N– tip implants and the N+ source/drain contact implants.

If desired, an additional P+ implant can be made into n-well 304 as described above in order to further decrease the contact resistance to PMOS device of the present invention. Finally, silicide 342 is formed on the gate electrodes and the source/drain contact regions as described above in order to reduce the contact resistance of the fabricated transistors.

At this time, the second preferred method of fabricating a novel PMOS transistor utilizing a doped silicon glass layer and a conventional NMOS transistor is complete. Standard interconnection techniques can now be used to interconnect the fabricated NMOS and PMOS transistors into a function integrated circuit.

Illustrated and described with respect to FIGS. 5a–5f is a third preferred embodiment of the present invention where a novel NMOS transistor with a low resistant tip region and novel PMOS transistor with a low resistance tip region are formed in a CMOS process.

According to the third preferred method of the present invention, a semiconductor substrate having a p-type region 302, a gate dielectric 303, a first gate electrode 306, a n-type region 304, a second gate electrode 308 and isolation regions 305, such as substrate 300 shown and described with respect to FIG. 3a is provided.

Figure 5A:
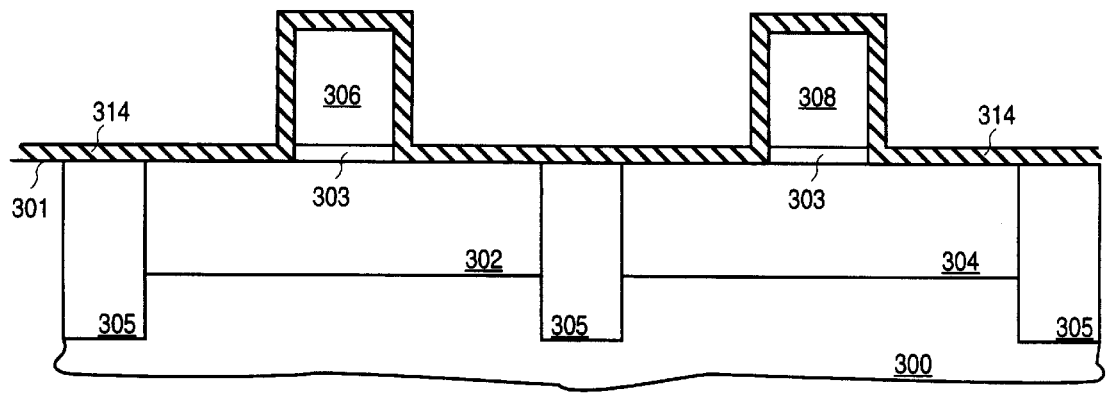
Figure 5B:
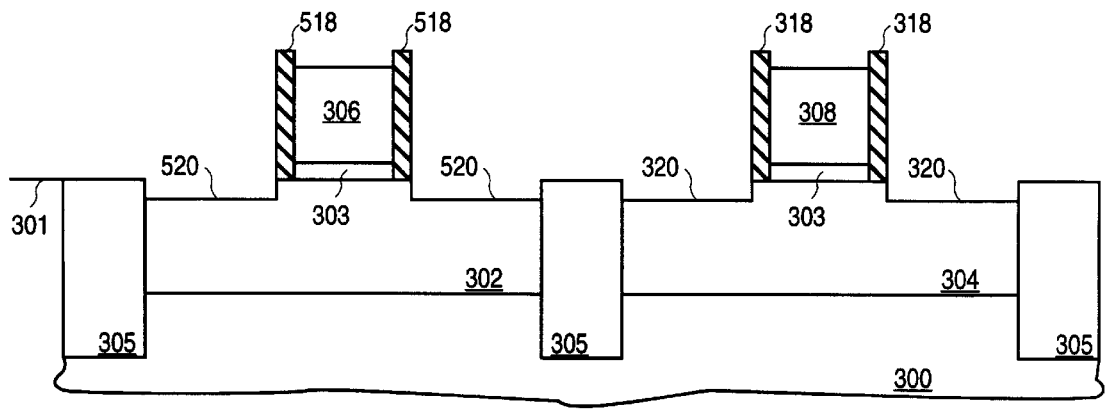

Next, as shown in FIG. 5a, a hot-wall silicon nitride layer 314 is blanket deposited over substrate 300 including p-well 302, gate electrode 306, n-well 304, and gate electrode 308 as described above. Next, as shown in FIG. 5b, silicon nitride layer 314 is antisotropically etched as described above to form a first pair of sidewall spacers 318 adjacent to the outside edges of gate electrode 308 and a first pair of silicon nitride spacers 518 formed adjacent to the first gate electrode 306.

The antisotropic sidewall spacer etch is continued into substrate 300 in order to form a pair of recesses 320 in n-well 304 in alignment with the outside edges of silicon nitride spacers 318, and a pair of recesses 520 in p-well 302 in alignment with the outside edges of silicon nitride spacers 518. It is to be appreciated that since recesses 520 and 320 are formed simultaneously, they are formed to the same depth. Additionally, it is to be appreciated that gate electrode 306, and gate electrode 308 become etched during the recess portion of the etch as shown in FIG. 5b.

Next, a masking layer is blanket deposited over substrate 300 including p-well 302, gate electrode 306, n-well 304 and gate electrode 308. The masking layer is formed to a thickness between 100–2000 Å with 200 Å being preferred. The masking layer is preferably an undoped oxide layer formed by chemical vapor deposition utilizing approximately 3300 sccms of TEOS and approximately 5000 sccms of $O_3/O_2$ at a ratio of approximately 12%–88%, respectively, and a temperature of approximately 500° C. and a pressure of approximately 100 mtorr. It is to be noted that the masking layer of the present invention is preferably formed at a low temperature in order to keep the thermal budget down.

Figure 5C:
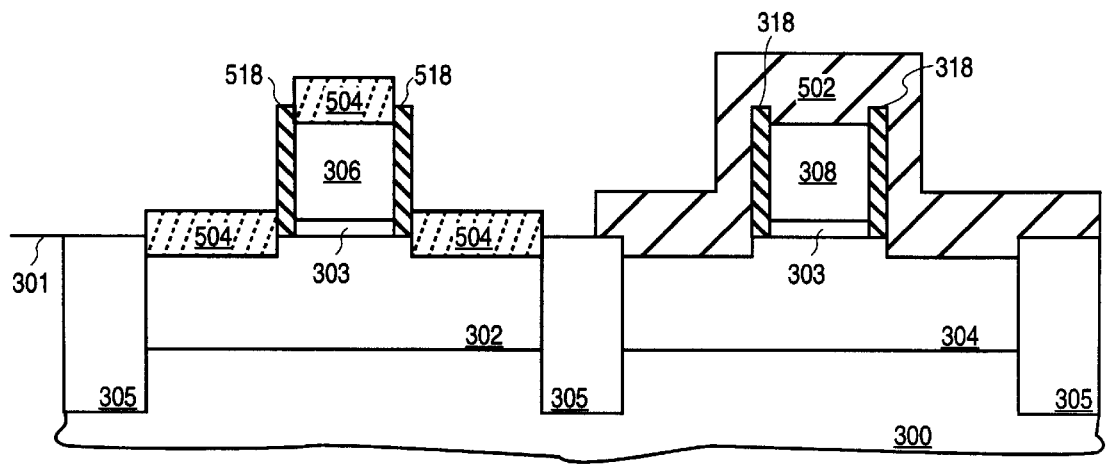
FIG. 5c is an illustration of a cross-sectional view showing the masking of the n-well and the formation of semiconductor material on the p-well of the substrate of FIG. 5b.

Next, the CVD masking layer is patterned with well known photolithography techniques and etched with any well known etchant such as a 1:1 HF solution or a BOE solution (10% HF, 12% NH$_4$F, 28.9% Di water) to form a CVD oxide mask 502 over n-well 304 and gate electrode 308 as shown in FIG. 5c.

Next, as shown in FIG. 5c, an n-type conductivity semiconductor material 504 is selectively deposited into recesses 520 and onto the top surface of gate electrode 306. CVD oxide mask 502 prevents the selective deposition of n-type semiconductor material 504 onto n-well 304 and gate electrode 308. According to the preferred embodiment of the present invention, n-type semiconductor material 504 is preferably a silicon germanium alloy insitu doped with n-type impurities to a concentration level between $1\times10^{18}/cm^3$ to $5\times10^{20}/cm^3$ with a concentration of approximately $1\times10^{20}/cm^3$ being preferred.

According to the present invention, semiconductor 504 is preferably a silicon germanium semiconductor alloy with germanium comprising approximately 10–50% of the alloy. A n-type silicon germanium semiconductor alloy can be formed by decomposition of approximately 20 sccms of dichlorosilane (SiH$_2$Cl$_2$), approximately 130–180 sccms of 1% hydrogen diluted germanium (GeH$_4$), and a n-type dopant source of approximately 5–50 sccms of 1% hydrogen diluted phosphane (PH$_3$) at temperature between 600–800° C., with 700° C. being preferred, and a power of approximately 20 torrs. In order to increase the selectivity of the deposition process, approximately 25–50 sccms of HCl can be added to the gas composition. A silicon germanium semiconductor material is preferred because it exhibits good selectivity to silicon during deposition, making the present invention very manufacturable. Additionally, such as silicon germanium semiconductor alloy exhibits many microscopic "faults" and "dislocations" which aid in the solid state diffusion of dopants through the semiconductor material.

It is to be appreciated that any semiconductor material which can be selectively deposited can be used to form semiconductor material 504. For example, semiconductor material 504 can be selectively deposited polycrystalline formed from dichlorosilane and HCl in an H$_2$ ambient at a temperature between 600–900° C. or can be a selectively deposited single crystalline silicon formed by any well known technique. Prior to the selective deposition of semiconductor material 504, one can utilize a 600°–900° C. bake in an H$_2$ ambient to remove native oxides from the exposed silicon/polysilicon areas.

It is to be appreciated that the thickness and doping concentration level of semiconductor material 504 determines the resistivity of the raised tip portion of the fabricated NMOS transistor. A thicker and higher doped semiconductor material 504 results in transistor with lower parasitic resistance. An adverse capacitance, i.e. Miller capacitance, however can be developed when opposite voltages are placed on gate electrode 306 and semiconductor material 504. The higher the doping and the thicker the semiconductor material 504 is, the greater is the Miller capacitance. Thus, a trade-off must be made between the transistor's parasitic resistance and its Miller capacitance.

Figure 5D:
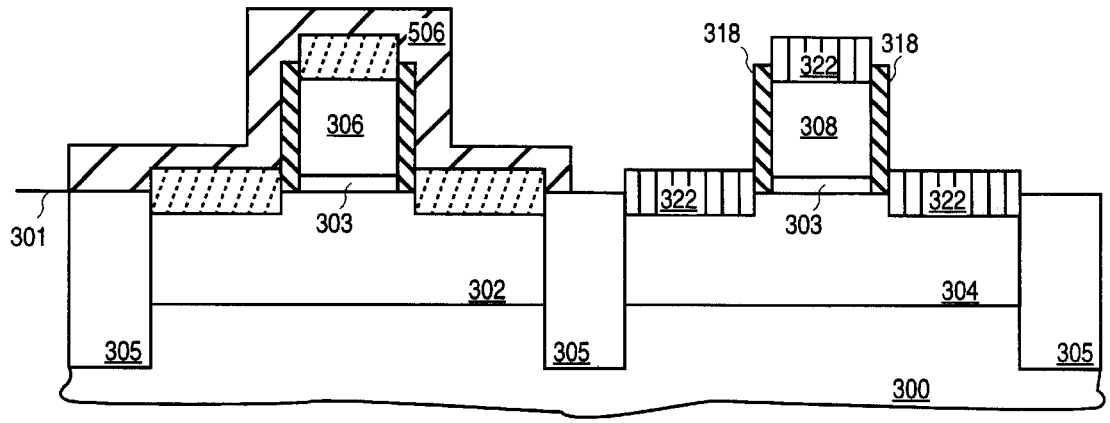
FIG. 5d is an illustration of a cross-sectional view showing the formation of a mask over the p-well and the formation of semiconductor material on the n-well of the substrate of FIG. 5c.

Next, as shown in FIG. 5d, CVD oxide mask 502 is removed from n-well 304 by wet etching with a 1:1 HF solution or a BOE solution as described above. Next, a mask 506 is formed over p-well 302 and gate electrode 306 as shown in FIG. 5d. Mask 506 is preferably undoped CVD oxide formed to a thickness and by methods similar to CVD oxide mask 502 described above. It is to be noted that it is desirable to make masks 502 and 506 of a material which can be selectively etched with respect to field isolation regions 305. In this way, masking layer 502 and 506 can be patterned and removed without affecting the integrity of isolation regions 305.

After p-well 302 is sufficiently masked, a p-type selectively deposited semiconductor material 322 is deposited into recesses 320 and onto the gate electrode 308, as shown in FIG. 5d, and as described above. P-type semiconductor material 322 is preferably a boron insitu doped silicon germanium alloy formed to thicknesses and conductivity level and by methods described above. After the formation of semiconductor material 322, CVD oxide mask 506 is removed by wet etching with a 1:1 HF solution or a BOE solution.

It is to be appreciated that although n-type semiconductor material 504 is illustrated as being formed before p-type semiconductor material 322, it is not necessary to form n-type semiconductor material 504 first. As such, one can first mask p-well 302 and form p-type semiconductor material 322 and then mask n-well 304 and form semiconductor material 504.

Figure 5E:
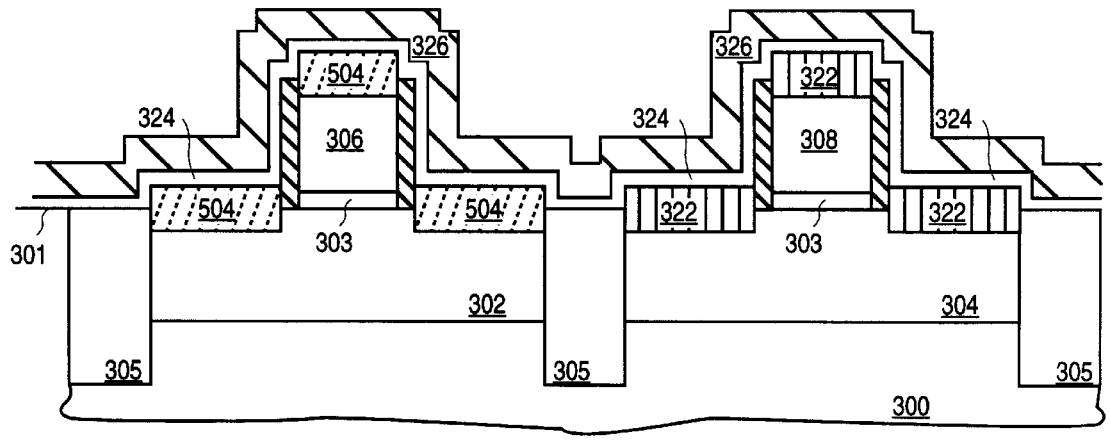
FIG. 5e is an illustration of a cross-sectional view showing the formation of a thin oxide layer and the formation of a thicker silicon nitride layer over the substrate of FIG. 5d.
Figure 5F:
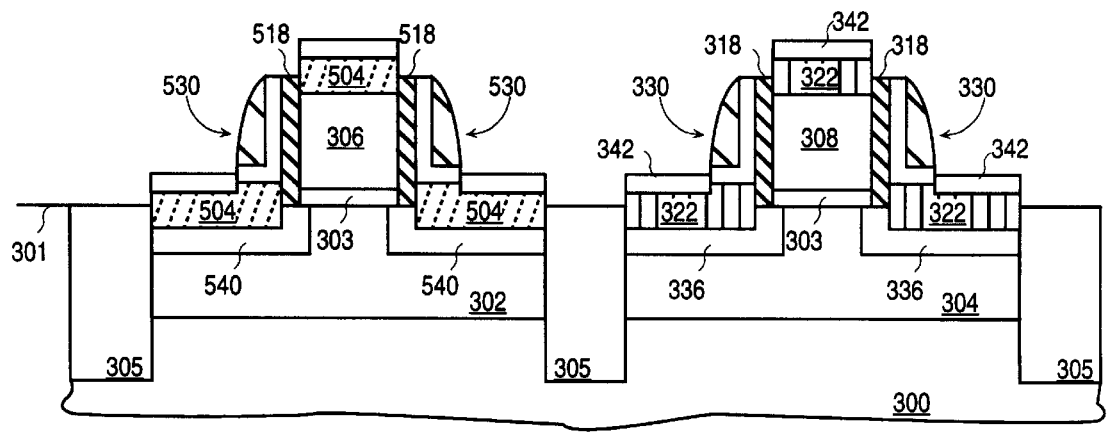
FIG. 5f is an illustration of a cross-sectional view showing the formation of a second pair of spacers and the out diffusion of dopants from semiconductor material on the substrate of FIG. 5e.

Next, as shown in FIG. 5e, a thin CVD oxide layer 324 and a thicker silicon nitride layer 326 are blanket deposited over substrate 300 as described above. Next, as shown in FIG. 5f, CVD oxide layer 324 and hot-wall silicon nitride layer 326 are antisotropically etched as described above to form a second pair of composite sidewall spacers 330 adjacent to the outside edges of first silicon nitride spacers 318 adjacent to gate electrode 308, and a second pair of composite sidewall spacers 530 adjacent to the outside edges of first silicon nitride spacers 518 formed adjacent to gate electrode 306. Composite sidewall spacers 530 are formed on n-type semiconductor material 504 and comprise CVD oxide layer 324 and hot-wall silicon nitride layer 326.

The RTP anneal process of the present invention, as described above, is now utilized to drive n-type impurity from semiconductor material 504 into p-well 302 to form diffusion doped semiconductor 540. Diffusion doped semiconductor 540 extends beneath silicon nitride spacer 518 and at least 100 Å, and preferably 500 Å, beneath (laterally) gate electrode 306 to form a NMOS transistor with a tip having an ultra shallow portion and a raised portion. Additionally, the RTP anneal process drives p-type impurities from semiconductor material 322 into n-well 304 to form diffusion doped semiconductor 336. Diffusion doped semiconductor 336 extends beneath silicon nitride spacers 318 and at least 100 Å and preferably 500 Å beneath (laterally) gate electrode 308 to form a PMOS transistor with a tip having an ultra shallow portion and a raised portion.

Next, silicide 342 is formed, as described above, on semiconductor material 504 in alignment with the outside edges of composite sidewall spacers 530 and on semiconductor material 322 in alignment with the outside edges of composite spacers 330. Additionally, silicide 342 tan be formed on semiconductor material 504 and 322, and on the tops of gate electrodes 306 and 308, respectively. Additionally, if desired, masking and ion implantation can be used prior to silicide formation to further increase the doping concentrations of the source/drain contact regions. At this time, the fabrication of a novel PMOS and a novel NMOS transistors with low resistance tip regions is complete. Well known interconnection techniques can now be utilized to couple the various PMOS and NMOS transistors of the present invention into a functional integrated circuit.

It is to be noted that FIGS. 5a–5f illustrate a method of forming two novel transistors wherein two masking steps (FIGS. 5c and 5d) are utilized to selectively deposit a n-type semiconductor material 504 over p-well 302 and a p-type semiconductor material 322 over n-well 304. If desired, however, a single masking step can be used to form two different conductivity type semiconductor materials over substrate 300. For example, after forming recesses, as shown in FIG. 5b, a semiconductor material of one conductivity type, for example, N– type can be formed over both p-well 302 and n-well 304. P-well 302 would then be masked, as shown in FIG. 5d, and an ion implantation of p-type conductivity ions made to counter dope (i.e. overwhelm) the n-type semiconductor material over n-well 304 and convert it into p-type semiconductor.

A fourth embodiment of the present invention is illustrated and described with respect to FIGS. 6a–6d where a novel PMOS transistor with a low resistant tip and a novel NMOS transistor with a low resistant tip is fabricated in a CMOS process. In the fourth preferred embodiment of the present invention, ion implantation techniques are utilized to dope selectively deposited undoped semiconductor material during the fabrication of a novel NMOS transistor. Although ion implantation of an undoped semiconductor material is preferably used and illustrated with respect to the formation of a novel NMOS device, such a technique can be used to fabricate a novel PMOS device, if desired.

Figure 6A:
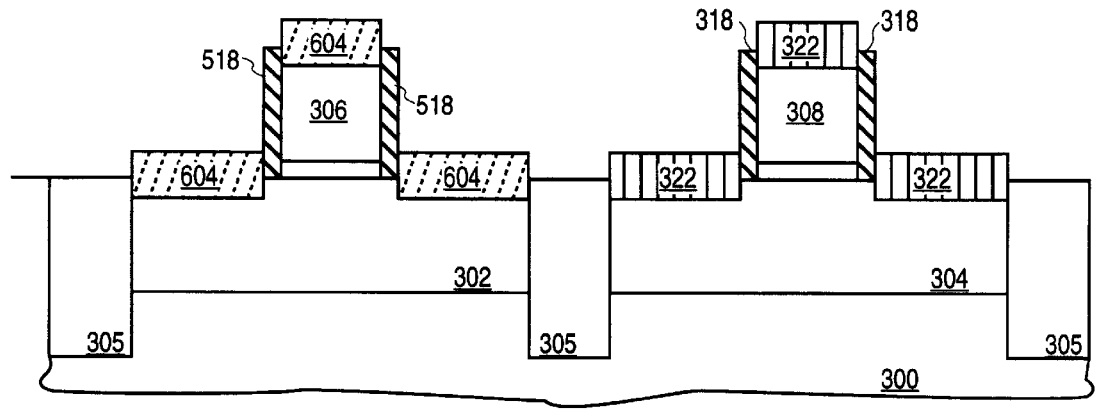
FIG. 6a is an illustration of a cross-sectional view showing the formation of p-type semiconductor material on a n-well, and the formation of undoped semiconductor material on a p-well of a substrate.

According to the fourth preferred embodiment of the present invention, as shown in FIG. 6a, processing of a silicon substrate 300 occurs exactly as described and illustrated with respect to FIGS. 5a–5d, except that an undoped semiconductor material 604 is selectively deposited into recesses 520 and onto the top of gate electrode 306 in place of n-type semiconductor material 504. Undoped semiconductor material 604 is preferably a silicon-germanium alloy formed as described above except that a source of impurity dopants is not included in the gas mix.

Figure 6B:
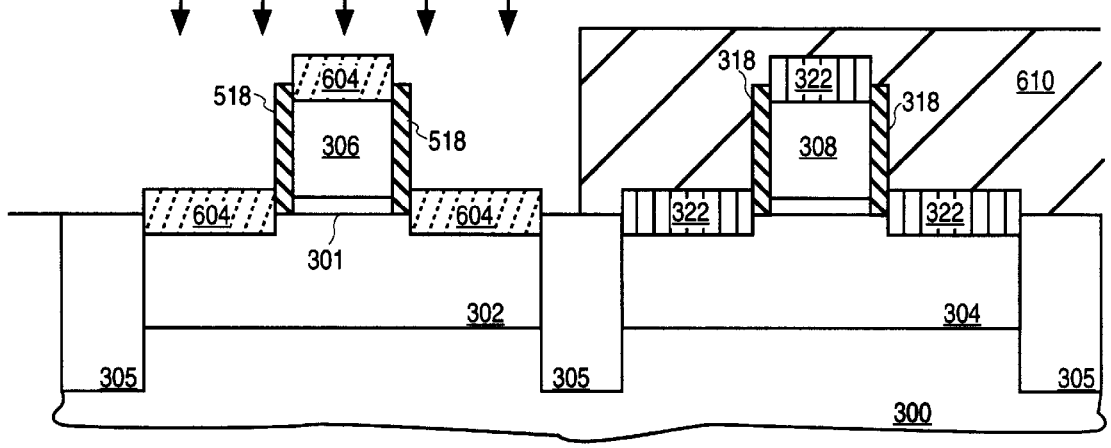

Next, as shown in FIG. 6b, a photoresist mask 610 is formed over n-well 304 and gate electrode 308. Next, substrate 300 is subjected to an N– tip implant which implants n-type conductivity impurities into undoped semiconductor material 604 in alignment with the outside edges of silicon nitride spacers 518. Additionally, the N– tip implant dopes the undoped semiconductor material 604 formed on the top of gate electrode 608. Undoped semiconductor material 604 is preferably doped to a concentration in the range of approximately $1\times10^{18}$–$1\times10^{19}$/cm$^3$ by ion implanting arsenic atoms at a dose of approximately $1\times10^{15}$/cm$^2$ and an energy of approximately 20–80 keV. Photoresist mask 610 prevents n-well 304 from being doped during the N– tip implant. Photoresist mask 610 is then removed with well known techniques.

Figure 6C:
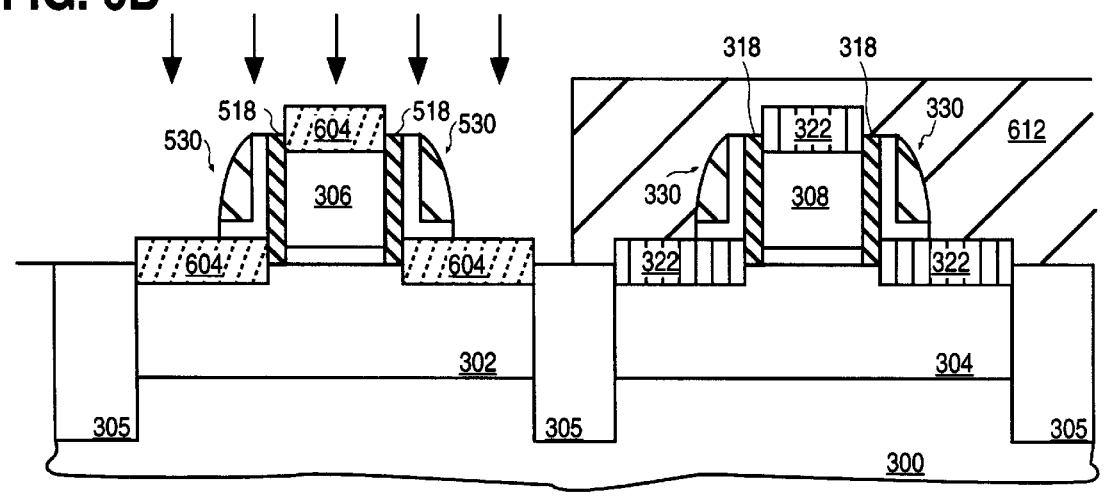
FIG. 6c is an illustration of a cross-sectional view showing the formation of sidewall spacers and the implantation of the substrate of FIG. 6b.

Next, as shown in FIG. 6c, a second pair of composite sidewall spacers 330 are formed on semiconductor material 322 adjacent to the outside edges of silicon nitride spacers 318, and a second pair of composite sidewall spacers 530 are formed on N– implanted semiconductor material 604 in alignment with the outside edges of silicon nitride spacers 518. Composite spacers 330 and 530 are formed by the methods described above.

Next, a photoresist mask 612 is formed over n-well 304 and gate electrode 308 as shown in FIG. 6c. Next, substrate 300 is subjected to a N+ source/drain implant which implants n-type conductivity impurities into N– implanted semiconductor material 604 in alignment with the outside edges of composite sidewall spacers 530. Semiconductor material 604 is preferably doped to a concentration in the range of approximately $1\times10^{19}$/cm–$5\times10^{20}$/cm$^3$ by ion implanting arsenic atoms at a dose of $5\times10^{15}$/cm$^2$ at an energy at approximately 50–100 keV. Photoresist mask 612 prevents n-well 304 from being doped during the N+ implant.

Figure 6D:
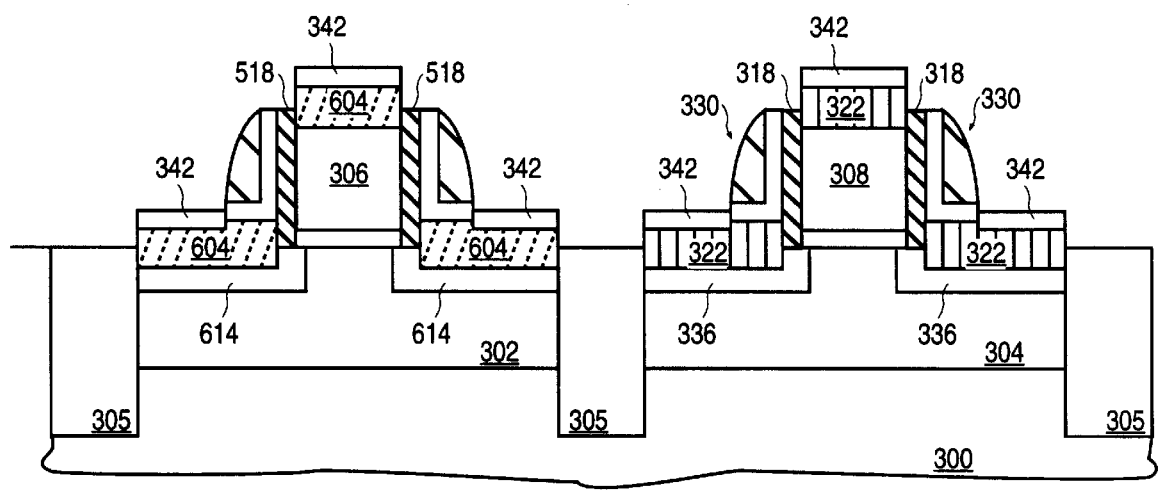
FIG. 6d is an illustration of a cross-sectional view showing the diffusion of impurities from semiconductor material and the formation of silicide of the substrate of FIG. 6c.

Next, as shown in FIG. 6d, photoresist mask 612 is stripped by well known techniques. Next, the RTP anneal of the present invention is utilized to drive implanted n-type impurities from semiconductor material 604 into p-well 302 to form a diffusion doped region 614 beneath nitride spacer 518, and at least 100 Å, and preferably 500 Å, laterally beneath gate electrode 302. Similarly, the RTP anneal of the present invention drives insitu doped p-type impurities into n-well 304 to form diffused semiconductor region 336 beneath silicon nitride spacers 318 and at least 100 Å and preferably 500 Å beneath gate electrode 308. It is to be appreciated, as shown in FIG. 6d, that both the NMOS transistor and the PMOS transistor have tip regions with an ultra shallow portion and a raised portion. Additionally, the RTP anneal of the present invention also drives implanted n-type dopants from semiconductor material 604 and insitu p-type dopants from semiconductor material 322 into gate electrodes 306 and 308, respectively. Additionally, the RTP anneal of the present invention is utilized to activate all of the front end ion implantation steps as described above.

Next, if desired, silicide 342 can be formed on semiconductor material 604 and semiconductor material 322 as described above. The formation of a novel NMOS device having an ion implanted semiconductor material and a novel PMOS device having an insitu doped semiconductor material is now complete. Standard and well known interconnection techniques can now be utilized to interconnect the PMOS and NMOS devices formed on substrate 300 into a functional integrated circuit.

Illustrated and described with respect to FIGS. 7a–7g is a fifth preferred embodiment of the present invention wherein a novel PMOS transistor having a low resistance tip and a novel NMOS transistor having a low resistance tip are fabricated in a CMOS process. In the fifth embodiment of the present invention, a boron doped glass layer is used in the PMOS transistor and an ion implanted semiconductor material is used in the NMOS transistor.

Figure 7A:
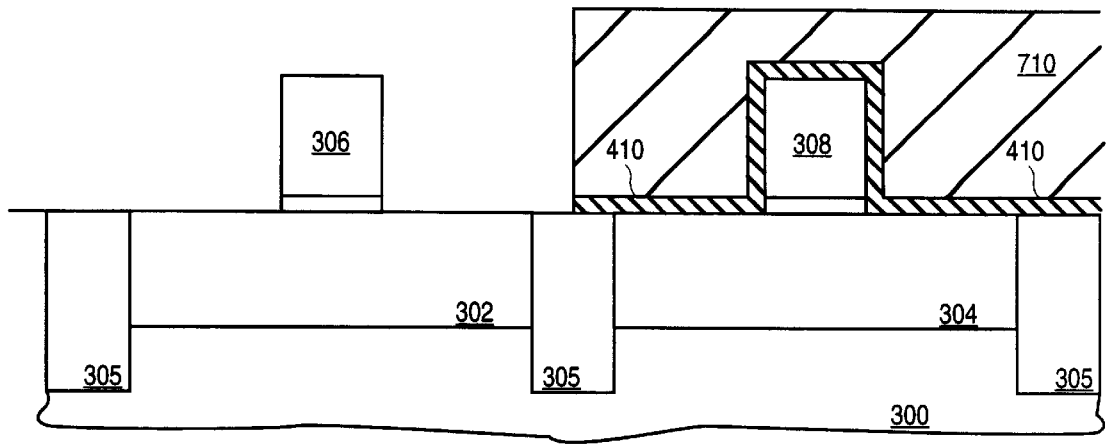

According to the fifth preferred method of the present invention, a semiconductor substrate having a p-type region 302, a gate dielectric 303, a first gate electrode 306, a n-type region 304, a second gate electrode 308 and isolation regions 305, such as substrate 300 shown and described with respect to FIG. 7a is provided.

Figure 7B:
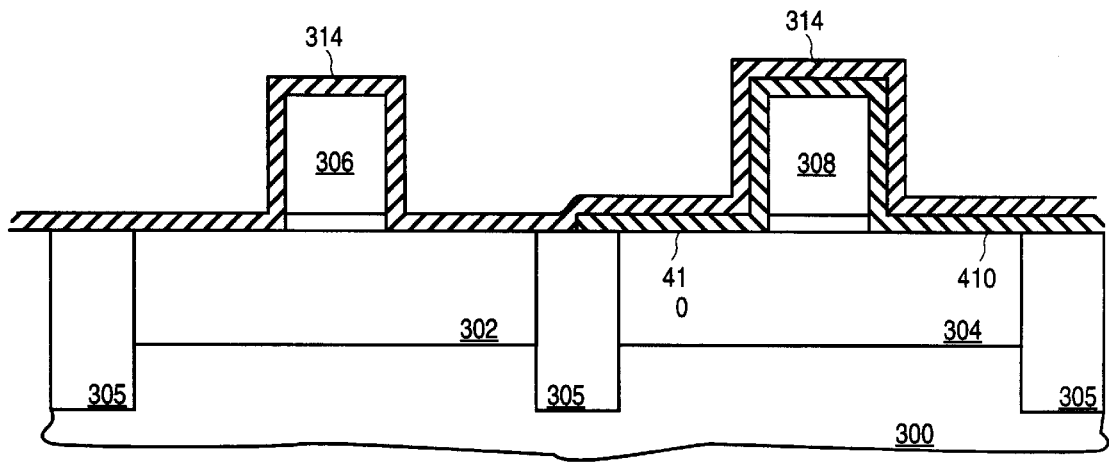
Figure 7C:
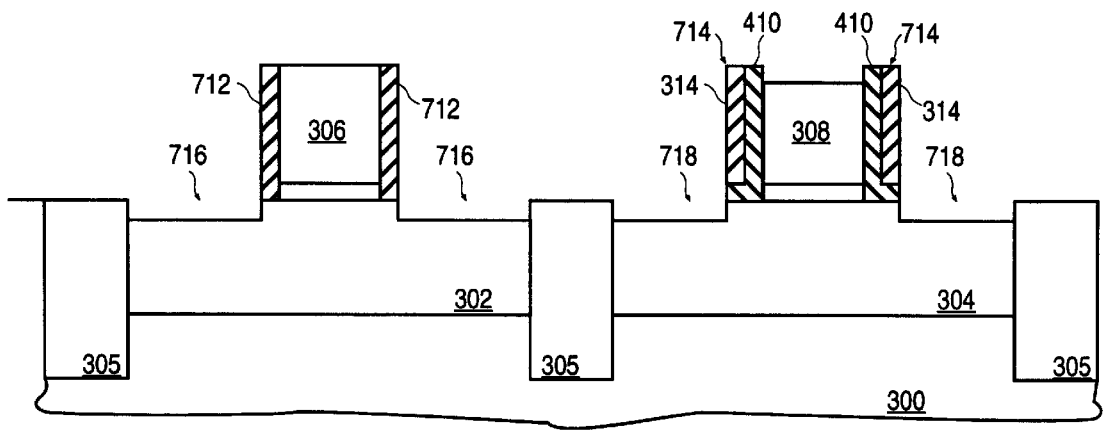
FIG. 7c is an illustration of a cross-sectional view showing the formation of spacers and recesses in the substrate of FIG. 7b.

According to the fifth preferred embodiment of the present invention, a boron doped glass layer 410 is blanket deposited, as described above, over semiconductor substrate 300 including p-well 302, gate electrode 306, n-well 304, and gate electrode 308. Boron doped glass layer 410 is then removed from p-well 302 and gate electrode 306 utilizing photoresist mask 710 as shown in FIG. 7a. Photoresist mask 710 is then removed and a hot-wall silicon nitride layer 314 is blanket deposited, as described above, over substrate 300 including p-well 302, gate electrode 306, and boron doped glass layer 410 over n-well 304 as shown in FIG. 7b.

Silicon nitride layer 314 and boron doped glass layer 410 are then antisotropically etched as described above to form a first pair of composite sidewall spacers 714 adjacent to opposite sidewalls of gate electrode 308 and a first pair of silicon nitride spacers 712 adjacent to opposite sidewalls of gate electrode 306. The antisotropic spacer etch is continued into substrate 300 in the manner described above, in order to form a pair of recesses 716 in p-well 302 in alignment with the outside edges of silicon nitride spacers 712 and to form a pair of recesses 718 in n-well 304 adjacent to composite sidewall spacers 714.

Figure 7D:
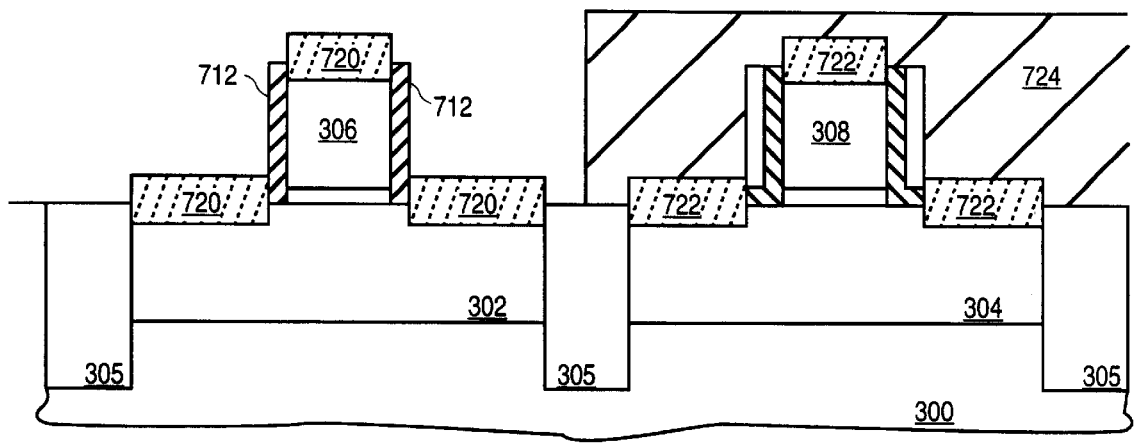
FIG. 7d is an illustration of a cross-sectional view showing the formation of semiconductor material over the substrate of FIG. 7c.

Next, undoped semiconductor material 720 is selectively deposited into recesses 716 and onto the top of gate electrode 306. Additionally, undoped semiconductor material 722 is selectively deposited into recesses 718 and onto the top of gate electrode 308. Next, a photoresist mask 724 is formed over n-well 304 and gate electrode 308 as shown in FIG. 7d. Next, arsenic or phosphorous is implanted into undoped semiconductor material 720 at a dose of approximately $1 \times 10^{15}/cm^2$ and an energy of approximately 10 keV. Next, resist mask 724 is removed from semiconductor substrate 300. Next, although not shown, p-well 302 is covered with a photoresist mask and semiconductor material 722 implanted with boron atoms at a dose of $5 \times 10^{13}/cm^2$ at an energy of approximately 7–12 keV in order to make undoped semiconductor material 722 p-type semiconductor material with a concentration of approximately $5 \times 10^{18}/cm^3$.

Figure 7E:
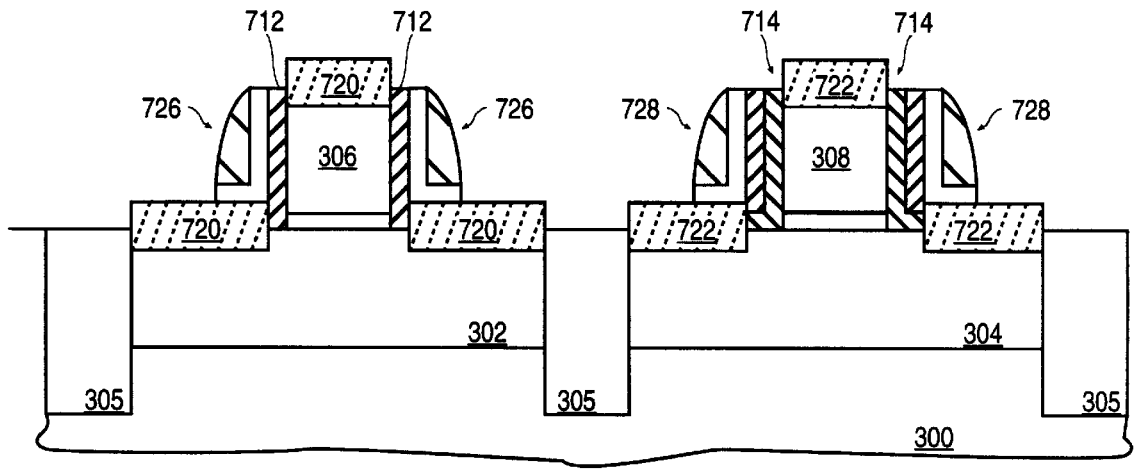
FIG. 7e is an illustration of a cross-sectional view showing the formation of a second pair of spacers over the substrate of FIG. 7d.

Next, as shown in FIG. 7e, a second pair of composite sidewall spacers 726 are formed on deposited semiconductor material 720 and adjacent to the outside edges of silicon nitride sidewall spacers 712. Additionally, a second pair of composite sidewall spacers 728 are formed on semiconductor material 722 adjacent to the outside edges of the first pair of composite sidewall spacers 714. It is to be appreciated that composite sidewall spacers 726 and 728 are formed by blanket depositing a thin oxide layer and a thicker silicon nitride layer, as described above, and then antisotropically etching to form spacers, as described above.

Next, although not shown, a resist mask is formed over the n-well 304 and gate electrode 308. A standard high dose N+ arsenic source/drain contact implant is then made in alignment with the outside edges of spacers 726 into semiconductor material 720. The resist mask is then removed and a new resist mask is then formed over p-well 302. A standard high dose P+ source/drain contact implant is then made into semiconductor material 722 in alignment with the outside edges of the second pair of sidewall spacers 728. The resist mask formed over p-well 302 is then removed.

Figure 7F:
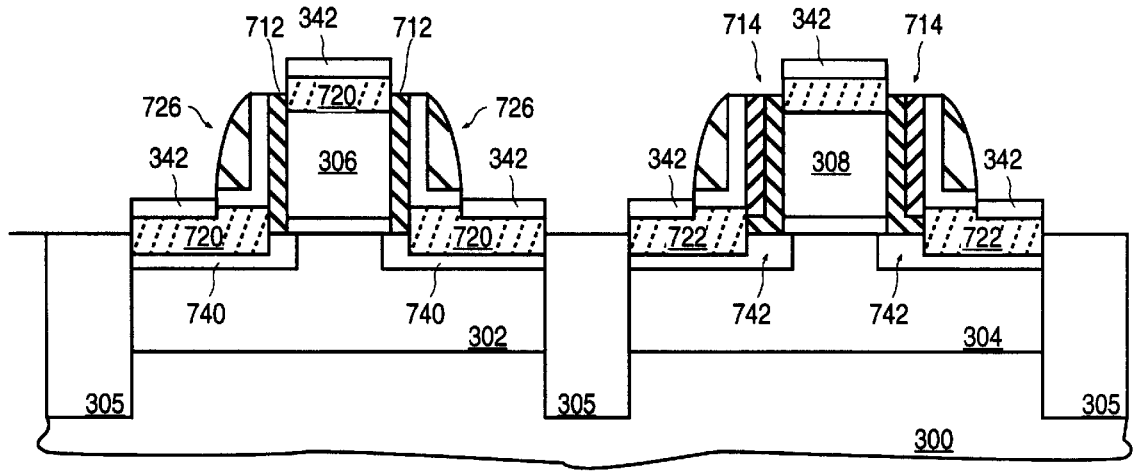
FIG. 7f is an illustration of a cross-sectional view showing the out diffusion of impurities from deposited semiconductor material and the formation of silicide on the substrate of FIG. 7e.

Next, as shown in FIG. 7f, the RTP anneal process of the present invention, described above, is utilized to diffuse n-type dopants from ion implanted semiconductor material 720 into p-well 302 and form diffused semiconductor region 740 beneath silicon nitride spacer 712 and at least 100 Å and preferably 500 Å beneath gate electrode 306. Additionally, the RTP anneal process of the present invention diffuses p-type dopants from boron doped glass layer 410 and ion implanted semiconductor material 722 into n-well 304 and form diffused semiconductor region 742 beneath a composite spacer 714 and at least 100 Å and preferably 500 Å beneath gate electrode 308. The RTP anneal step of the present invention also activates all prior well implants and drives dopants into gate electrodes 306 and 308. Silicide 342 can now be formed on semiconductor material 720 and 722 in order to decrease the contact resistance of the fabricated transistors.

Many alternative embodiments and specifics of the present invention have been described, however, one skilled in the art will appreciate that many of the features in one embodiment are equally applicable to other embodiments. Additionally, although many specific dimensions, materials, and concentrations have been described, it is to be appreciated that these specific dimensions, materials, and concentrations are not to be taken as limiting. Additionally, one skilled in the art will appreciate the ability to scale the transistor of the present invention to form both larger and smaller devices. The scope of the present invention is not intended to be limited to the detailed description of the present invention and rather is to be determined by the claims which follow.

Thus, novel transistors with low resistance ultra shallow tip regions and their methods of fabrication in a CMOS process have been described.

We claim:

1. A method of forming a pair of complementary metal oxide semiconductor transistors in a semiconductor substrate, said method comprising the steps of:
   a) forming a first gate dielectric and a first gate electrode on a first portion of said semiconductor substrate having a first conductivity type and forming a second gate dielectric and a second gate electrode on a second portion of said semiconductor substrate having a second conductivity type;
   b) forming a silicon nitride layer over said first portion of said semiconductor substrate including said first gate electrode and over said second portion of said semiconductor substrate including said second gate electrode;
   c) removing said silicon nitride layer from said second portion of said silicon substrate and from the top of said second gate electrode to thereby form a first pair of silicon nitride spacers adjacent to opposite sides of said second gate electrode;
   d) forming a pair of recesses in said second portion of semiconductor substrate in alignment with said first pair of silicon nitride spacers; and
   e) depositing a semiconductor material in said pair of recesses in said second portion of said semiconductor substrate.

2. The method of claim 1 further comprising the steps of:
   diffusing dopants from said deposited semiconductor material into said substrate beneath said first pair of sidewall spacers.

3. The method of claim 2 further comprising the steps of:
   prior to forming said silicon nitride layer, implanting ions of a second conductivity type into said first portion of said semiconductor substrate in alignment with opposite sides of said first gate electrode.

4. The method of claim 3 further comprising the steps of:
   forming a first pair of sidewall spacers adjacent to opposite sides of said first gate electrode; and
   implanting ions of a second conductivity type into said first portion of said semiconductor substrate in alignment with said first pair of sidewall spacers adjacent to said first gate electrode to thereby form a pair of source/drain contact regions in said first portion of said semiconductor substrate.

5. The method of claim 4 wherein said first conductivity type is P-type conductivity and said second conductivity type is N-type conductivity.

6. The method of claim 4 further comprising the steps of:
   forming a second pair of sidewall spacers on said deposited semiconductor material adjacent to said first pair of silicon nitride spacers, respectfully.

7. The method of claim 6 further comprising the steps of:
   forming silicide on said source/drain contact region and on said first gate electrode and forming silicide on said deposited semiconductor material in alignment with the outside edges of said second pair of sidewall spacers and on said second gate electrode.

8. The method of claim 2 wherein said diffusion step utilizes an annealing with a rapid thermal process in an ambient comprising nitrogen and oxygen.

9. The method of claim 8 wherein said annealing with said rapid thermal process comprises the steps of:

annealing said substrate at a first temperature in a first ambient comprising $O_2$ and $N_2$ to form a thin oxide cap on said semiconductor material in order to reduce out diffusion of said impurities from said semiconductor material; and after forming said thin capping layer, annealing said substrate in a second ambient comprising $N_2$ at a second temperature which is higher than said first temperature to drive said impurities from said semiconductor material into said substrate.

10. The method of claim 1 wherein each of said silicon nitride layer is formed from a hot-wall process at a temperature less than or equal to 800° C.

11. The method of claim 1 wherein said semiconductor material is selectively deposited insitu doped semiconductor material.

12. A method of forming a pair of complementary metal oxide semiconductor transistors in a semiconductor substrate, said method comprising the steps of:

a) forming a first gate dielectric and a first gate electrode on a first portion of said semiconductor substrate having a p-type conductivity and forming a second gate dielectric and a second gate electrode on a second portion of said semiconductor substrate having a n-type conductivity;

b) forming a boron doped glass layer over said second portion of said semiconductor substrate and said second gate electrode;

c) forming a silicon nitride layer over said first portion of said semiconductor substrate including said first gate electrode and over said boron doped glass layer over said second portion of said semiconductor substrate including said second gate electrode;

d) removing said silicon nitride layer and said boron doped glass layer from said second portion of said silicon substrate and from the top of said second gate electrode to thereby form a first pair of composite sidewall spacers adjacent to opposite sides of said second gate electrode; and e) forming a semiconductor material on said second portion of said semiconductor substrate adjacent to said first pair of composite sidewall spacer.

13. The method of claim 12 further comprising the steps of:

diffusing dopants from said semiconductor material and from said boron doped glass into said substrate beneath said first pair of composite sidewall spacers.

14. The method of claim 13 further comprising the steps of:

prior to forming said silicon nitride, implanting ions of a n-type conductivity into said first portion of said semiconductor substrate in alignment with opposite sides of said first gate electrode.

15. The method of claim 14 further comprising the steps of:

forming a first pair of sidewall spacers adjacent to opposite sides of said first gate electrode; and implanting ions of a second conductivity type into said first portion of said semiconductor substrate in alignment with said first pair of sidewall spacers to thereby form a first pair of source/drain contact regions.

16. The method of claim 15 further comprising the steps of:

forming a second pair of sidewall spacers on said first semiconductor material adjacent said first pair of composite sidewall spacers, respectfully.

17. The method of claim 16 further comprising the steps of:

forming silicide on said first pair of source/drain contact regions and said first gate electrode and forming silicide on said first semiconductor material in alignment with said second pair of sidewall spacers and on said second gate electrode.

18. The method of claim 12 wherein said first semiconductor material is insitu doped with boron.

19. The method of claim 13 wherein said diffusion step utilizes an annealing with a rapid thermal process in an ambient comprising nitrogen and oxygen.

20. The method of claim 12 wherein said silicon nitride layer is formed with a hot-wall process at a temperature less than or equal to 800° C.

21. A method of forming a pair of complementary metal oxide semiconductor transistors in a semiconductor substrate, said method comprising the steps of:

a) forming a first gate dielectric and a first gate electrode on a first portion of a first surface of said semiconductor substrate having a first conductivity type and forming a second gate dielectric and a second gate electrode on a second portion of said first surface of said semiconductor substrate having a second conductivity type;

b) forming a first pair of silicon nitride spacers along opposite sidewalls of said first gate electrode and a first pair of silicon nitride spacers along opposites sidewalls of said second gate electrode;

c) forming a pair of recesses in said first portion of said semiconductor substrate in alignment with said first pair of silicon nitride spacers along said first gate electrode and a pair of recesses in said second portion of said semiconductor substrate in alignment with said first pair of silicon nitride spacers along said second gate electrode;

d) forming a first masking layer over said second portion of said semiconductor substrate and said second gate electrode, and while said second portion of said semiconductor substrate and said second gate electrode is masked, forming a first semiconductor material having said second conductivity type in said pair of recesses formed in said first portion of said semiconductor substrate;

e) forming a second masking layer over said first portion of said semiconductor substrate and said first gate electrode and while said first portion of said semiconductor substrate and said first gate electrode are masked, forming a second semiconductor material having said first conductivity type in said pair of recesses formed in said second portion of said semiconductor substrate.

22. The method of claim 21 further comprising the step of diffusing dopants from said first semiconductor material into said first portion of said semiconductor substrate beneath said first pair of silicon nitride spacers formed adjacent to said first gate electrode, and diffusing dopants from said second semiconductor substrate beneath said first pair of silicon nitride spacers adjacent to said second gate electrode.

23. The method of claim 22 further comprising the steps of forming a second pair of sidewall spacers on said first semiconductor material adjacent to said first pair of silicon nitride spacers along said first gate electrode, and forming a second pair of sidewall spacers on said semiconductor material adjacent to said first pair of silicon nitride spacers along said second gate electrodes.

24. The method of claim 23 further comprising the step of forming a silicide on said first and second semiconductor material in alignment with the outside edges of each of said second pair of sidewall spacers, respectively.

25. The method of claim 21 wherein each of said first pair of silicon nitride spacers are formed from a silicon nitride layer formed from a hot-wall process at a temperature less than or equal to 800° C.

26. The method of claim 22 wherein said diffusion step utilizes an annealing with a rapid thermal process in an ambient comprising nitrogen and oxygen.

27. The method of claim 21 wherein said first and second masking layers comprise silicon dioxide.

28. The method of claim 21 wherein said first and second semiconductor material comprise silicon germanium.

29. The method of claim 21 wherein said first and said second semiconductor material is formed in said recesses and above said first surface of said semiconductor substrate.

30. The method of claim 21 wherein said first semiconductor material having said second conductivity type is formed by a method comprising the steps of:
  depositing an undoped semiconductor material; and
  ion implanting said undoped semiconductor material with ions of said second conductivity type.

31. The method of claim 21 further comprising the step of:
  implanting ions of said second conductivity type into said first semiconductor material in alignment with said outside edges of said second pair of sidewall spacers formed about said first gate electrode.

32. The method of claim 21 wherein said first semiconductor material is formed by insitu doped with impurities of said second conductivity type.

33. The method of claim 21 wherein said second semiconductor material is formed by insitu doping with impurities of said first conductivity type.

34. A method of forming a pair of complementary metal oxide semiconductor transistors in a semiconductor substrate, said method comprising the steps of:
  a) forming a first gate dielectric and a first gate electrode on a first portion of said semiconductor substrate having a p-type conductivity and forming a second gate dielectric and a second gate electrode on a second portion of said semiconductor substrate having a n-type conductivity;
  b) forming a boron doped glass layer over said second portion of said semiconductor substrate and said second gate electrode;
  c) forming a silicon nitride layer over said first portion of said semiconductor substrate including said first gate electrode and over said boron doped glass layer over said second portion of said semiconductor substrate including said second gate electrode;
  d) removing said silicon nitride layer from said first portion of said semiconductor substrate so as to form a first pair of silicon nitride spacers adjacent to opposite sides of said first gate electrode, and removing said silicon nitride layer and said boron doped glass layer from said second portion of said silicon substrate and from the top of said second gate electrode to thereby form a first pair of composite sidewall spacers adjacent to opposite sides of said second gate electrode;
  e) forming a pair of recesses in said first portion of said semiconductor substrate adjacent to said first pair of silicon nitride spacers and a pair of recesses in said second portion of said semiconductor substrate in alignment with said composite sidewall spacers;
  f) forming an undoped semiconductor material in said pair of recess in said first portion of said semiconductor substrate and in said pair of recesses in said second portion of said semiconductor substrate;
  g) implanting ions of n-type conductivity into said undoped semiconductor material formed in said pair of recess on said first portion of said semiconductor substrate to thereby form n-type semiconductor material; and
  h) implanting ions of p-type conductivity into said semiconductor material formed in said pair of recesses in said second portion of said semiconductor substrate to thereby form p-type semiconductor material.

35. The method of claim 34 further comprising the steps of:
  diffusing p-type dopants from said p-type semiconductor material and from said boron doped glass into said second portion of said semiconductor substrate beneath said first pair of composite sidewall spacers.

36. The method of claim 35 further comprising the steps of:
  diffusing n-type dopants from said n-type semiconductor material into said first portion of said semiconductor substrate beneath said first pair of silicon nitride spacers.

37. The method of claim 36 further comprising the steps of:
  forming a second pair of sidewall spacers on said n-type semiconductor material adjacent to said first pair of silicon nitride spacers.

38. The method of claim 37 further comprising the steps of:
  forming a second pair of sidewall spacers on said p-type semiconductor material adjacent to said first pair of composite sidewall spacers.

39. The method of claim 38 further comprising the steps of:
  forming silicide on said n-type semiconductor material and on said p-type semiconductor material adjacent to the outside edge of each of said second pair of sidewall spacers.

40. The method of claim 36 wherein said diffusion step utilizes an annealing with a rapid thermal process in an ambient comprising nitrogen and oxygen.

41. The method of claim 34 wherein said silicon nitride layer is formed with a hot-wall process.

42. A method of forming a pair of complementary metal oxide semiconductor transistors in a semiconductor substrate, said method comprising the steps of:
  a) forming a first gate dielectric and a first gate electrode on a first portion of a first surface of said semiconductor substrate having a first conductivity type and forming a second gate dielectric and a second gate electrode on a second portion of said first surface of said semiconductor substrate having a second conductivity type;
  b) forming a silicon nitride layer over said first portion of said semiconductor substrate including said first gate electrode and over said second portion of said semiconductor substrate including said second gate electrode;

c) removing said silicon nitride layer from said second portion of said silicon substrate and from the top of said second gate electrode to thereby form a first pair of silicon nitride spacers adjacent to opposite sides of said second gate electrode;

d) depositing a semiconductor material on said second portion of said first surface of said semiconductor substrate adjacent to said first pair of silicon nitride spacers; and e) diffusing dopants from said deposited semiconductor material into said substrate beneath said first pair of sidewall spacers.

43. The method of claim 42 wherein said diffusion step is accomplished by annealing with a rapid thermal process in an ambient comprising nitrogen and oxygen.

44. A method of diffusing impurities in a semiconductor process, said method comprising the steps of:

providing a semiconductor substrate having a plurality of regions doped with impurities;

annealing said substrate in a first ambient comprising oxygen and nitrogen at a first temperature for a first period of time; and after annealing in said first ambient, annealing said substrate in a second ambient comprising nitrogen at a second temperature for a second period of time, wherein said first anneal and said second anneal occur insitu.

45. The method of claim 44 wherein said first ambient comprises between 5–20% oxygen and between 95–80% nitrogen.

46. The method of claim 44 wherein said first temperature is less than said second temperature.

47. The method of claim 44 wherein said first temperature is between 500–700° C.

48. The method of claim 44 wherein said second temperature is approximately 850–1500° C.

49. The method of claim 44 wherein said first time is greater than said second time.

50. The method of claim 44 wherein said first time is between 20–60 seconds.

51. The method of claim 44 wherein said second time is between 10–40 seconds.

52. A method of forming a CMOS integrated circuit, said method comprising the steps of:

forming a gate dielectric layer on a semiconductor substrate;

forming a first gate electrode and a second gate electrode on said gate dielectric layer;

placing ions of a first conductivity type in alignment with opposite sidewalls of said first gate electrode;

placing ions of a second conductivity type in alignment with opposite sidewalls of said second gate electrode; and utilizing only a single Rapid Thermal Process to drive and activate said first conductivity type ions and said second conductivity type ions into said substrate to form a first pair of source/drain regions adjacent to said first gate electrode and a first pair of source/drain regions adjacent to said second gate electrode wherein said rapid thermal process utilizes a first ambient comprising oxygen and nitrogen and a second ambient comprising nitrogen.

* * * * *

UNITED STATES PATENT AND TRADEMARK OFFICE
CERTIFICATE OF CORRECTION

PATENT NO. : 6,165,826
DATED : December 26, 2000
INVENTOR(S) : Chau et al.

Page 1 of 1

It is certified that error appears in the above-identified patent and that said Letters Patent is hereby corrected as shown below:

<u>Column 16,</u>
Line 59, delete "tan", insert -- can --.

Signed and Sealed this

Twenty-eighth Day of May, 2002

Attest:

JAMES E. ROGAN
*Attesting Officer*  *Director of the United States Patent and Trademark Office*